United States Patent
Kuriyama et al.

(10) Patent No.: US 7,415,254 B2
(45) Date of Patent: Aug. 19, 2008

(54) POWER CONTROL CIRCUIT, SEMICONDUCTOR DEVICE AND TRANSCEIVER CIRCUIT USING THE SAME

(75) Inventors: Akira Kuriyama, Kokubunji (JP); Satoshi Tanaka, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 458 days.

(21) Appl. No.: 11/272,917

(22) Filed: Nov. 15, 2005

(65) Prior Publication Data

US 2006/0111060 A1    May 25, 2006

(30) Foreign Application Priority Data

Nov. 22, 2004   (JP)   ............... 2004-337266

(51) Int. Cl.
*H04B 1/04* (2006.01)
*H01Q 11/12* (2006.01)

(52) U.S. Cl. .............. 455/127.2; 455/522; 375/297; 330/278

(58) Field of Classification Search .............. 455/67.11, 455/69, 115.1, 126, 127.1, 127.2, 232.1, 455/234.1, 522, 552.1, 553.1; 375/296, 297; 330/75, 103, 127, 129, 250, 278, 282
See application file for complete search history.

(56) References Cited

U.S. PATENT DOCUMENTS

| | | | | |
|---|---|---|---|---|
| 5,132,634 A | * | 7/1992 | Suarez | 330/129 |
| 5,179,353 A | * | 1/1993 | Miyake | 330/129 |
| 5,369,789 A | * | 11/1994 | Kosugi et al. | 455/127.2 |
| 5,832,373 A | | 11/1998 | Nakanishi et al. | |
| 5,854,971 A | | 12/1998 | Nagoya et al. | |
| 5,977,831 A | * | 11/1999 | Davis et al. | 330/279 |
| 6,519,293 B1 | * | 2/2003 | Miyake | 375/297 |
| 6,728,224 B1 | | 4/2004 | Kakizaki et al. | |
| 2003/0224740 A1 | | 12/2003 | Takano et al. | |

FOREIGN PATENT DOCUMENTS

| | | |
|---|---|---|
| JP | 5-291854 | 4/1992 |
| JP | 8-274560 | 3/1995 |
| JP | 8-274559 | 4/1995 |
| JP | 2000-228646 | 2/1999 |
| JP | 2004-7443 | 2/2003 |

* cited by examiner

*Primary Examiner*—Quochien B Vuong
(74) *Attorney, Agent, or Firm*—Reed Smith LLP; Stanley P. Fisher, Esq.; Juan Carlos A. Marquez, Esq.

(57) ABSTRACT

There is provided a power control circuit having a stable high-speed operation, and a semiconductor device and a transceiver circuit using it. The power control circuit controls the gain of an amplifier so that power outputted from the amplifier reaches a desired value according to a digital control signal. The power control circuit includes a digital feedback loop which converts a detected signal obtained by detecting a value of the output power of the amplifier to a digital signal, determines a differential between the digital signal and the digital control signal, converts the differential to an analog signal and outputs a first feedback signal, an analog feedback loop which outputs a high frequency element corresponding to a differential between an analog signal to which the digital control signal is converted and the detected signal, as a second feedback signal, and an adder which determines the sum of the first and the second feedback signal and outputs a gain control signal for controlling the gain of the amplifier.

20 Claims, 14 Drawing Sheets

POWER CONTROL CIRCUIT, SEMICONDUCTOR DEVICE AND TRANSCEIVER CIRCUIT USING THE SAME

CLAIM OF PRIORITY

The present patent application claims priority from Japanese application JP 2004-337266 filed on Nov. 22, 2004, the content of which is hereby incorporated by reference into this application.

FIELD OF THE INVENTION

The present invention relates to a technique which controls output power at a mobile wireless communication terminal or wireless communication devices such as a transmitter of a base station for wireless communication, etc., and particularly to a power control circuit suitable for application to wireless communication devices adapted to a plurality of frequency bands and a plurality of systems.

BACKGROUND OF THE INVENTION

A mobile communication system typified by a cellular phone has been increased in penetration on a global scale. Several communication systems have been used according to the locality. As one of important techniques used in the mobile communication system, there is known a technique called APC (Auto Power Control) which controls transmitted power of a terminal according to received power at a terminal and a base station. A first reason why APC is required, resides in a reduction in power consumption. When the terminal is located near the base station, the transmitted power of the terminal is lowered to make it possible to achieve a reduction in power consumption of the terminal as compared with the case in which transmitted power is constant. A second reason is a near-far problem at a CDMA (Code Division Multiple Access) system.

In the CDMA, a plurality of terminals perform spread spectrum modulation on signals according to a spread spectrum using codes different from one another and transmit them. Thus, the same frequency band can be shared among the plurality of terminals. When, for example, a terminal B that exists at a distance far away from a base station A and a terminal C that exists at a distance near from the base station A are considered, a signal (desired wave) from the terminal B is subjected to level interference due to a signal (undesired wave) of the terminal C, thus resulting in the difficulty of accurate reception. In order to solve this problem, it is essential to precisely control power transmitted by each terminal and keep received power at the base station constant.

As an example of a power control circuit for realizing APC, an example that detects part of output power of a transmitted power amplifier and controls the transmitted power amplifier in such a manner that the result of detection reaches an ordered power level from a base station has been disclosed in a patent document 1: Japanese Patent Laid-Open No. H5(1993)-291854 (Page 3-4, FIG. 1). As another example, an example that detects part of output power of a power amplifier, and controls an available attenuator for changing an input level of the power amplifier to thereby sample and hold a control voltage of the available attenuator when the result of detection reaches a desired value has been disclosed in a patent document 2: Japanese Patent Laid-Open No. H8 (1996)-274560 (Page 5-6, FIG. 1). As a further example, an example has been disclosed in a patent document 3: Japanese Patent Laid-Open No. 2004-7443 (Page 11, FIG. 1), wherein in a wireless communication equipment having a phase control loop for controlling the phase of a carrier of a transmitted signal and an amplitude control loop for controlling output amplitude of a power amplifier circuit, an available gain amplifier circuit is disposed at the midpoint of a feedback circuit of the amplitude control loop, and the gain of the same amplifier circuit is controlled by a digital circuit to thereby control the output power of the power amplifier. As a still further example, an example has been disclosed in a patent document 4: Japanese Patent Laid-Open No. 2000-228646 (Page 4-5, FIG. 1), wherein two available gain devices are disposed ahead of a power amplifier section, and the result of detection of power outputted from the power amplifier section results in a value corresponding to control from a base station and the two available gain devices are controlled such that a change in phase does not occur. As a still further example, an example that detects part of output power of a transmitted power amplifier and controls the transmitted power amplifier by a digital circuit such that the result of detection complies with instructions given from a base station has been disclosed in a patent document 5: Japanese Patent Laid-Open No. H8 (1996)-274559 (Page 3, FIG. 3).

SUMMARY OF THE INVENTION

In the technique disclosed in the patent document 1, a feedback circuit is susceptible to temperature changes and a variation in power supply because it is constituted of an analog circuit, and hence stability and accuracy thereof become insufficient unavoidably. Further, since only closed loop control is made, the action of suppressing a change (envelope) in amplitude value due to modulation is continued even though the average value of the amplitude of a signal transmitted within a feedback circuit converges, where the output signal of the transmitted power amplifier is of a signal with amplitude modulation. Therefore, the suppression of this change is fed back to the transmitted power amplifier as noise. As a result, it is not possible to avoid degradation of the output signal of the transmitted power amplifier. Thus, there is a limit to a communication system to which the present technique is applicable.

In the technique disclosed in the patent document 2, a sample hold leak (phenomenon that varies in voltage for holding a capacitor due to the leak of an electrical charge of a capacitor constituting a sample and hold circuit) occurs because the sample and hold circuit is similarly realized by an analog circuit, so that it is difficult to hold the output signal of the power amplifier at a constant value.

In contrast, the techniques disclosed in the patent documents 4 and 5 are capable of controlling the relative value of the output power of the power amplifier in detail because digital signal processing is used. When, however, high-speed power control in a burst mode such as GSM (Global System for Mobile Communication) or the like being in widespread use in Europe is performed, there is a possibility that a feedback circuit will be brought into in stabilization or oscillations because the phase of a feedback signal corresponding to a clock frequency is turned 180° due to a clock delay contained in the digital signal processing.

Now, a plurality of communication systems exist in mobile communication typified by a cellular phone. For example, a W-CDMA (Wide-band Code Division Multiple Access) corresponding to a wireless communication system for 3rd generation having come into service in recent years is known in Europe in addition to above GSN being in widespread use as a wireless communication system for 2nd generation, and EDGE (Enhanced Data rates for GSM Evolution) improved in data communication speed or rate of GSM. Further, cdma1x corresponding to the wireless communication system for 3rd generation is in widespread use in North America in addition to a PCS (Personal Communication System) corresponding to the wireless communication system for 2nd generation.

Further, a plurality of frequency bands are used in the respective communication systems. For example, an 800 to 900 MHz band called "low band" and an 1800 to 1900 MHz band called "high band" are used in GSM.

Thus, since the plurality of communication systems (modes) and the plurality of frequency bands become existent in mixed form in the same region, a cellular phone needs to be brought into multi-band/multi-mode form. For instance, a cellular phone adapted to GSM/EDGE/W-CDMA is required in Europe. Even though the cellular phone is brought into multi-band/multi-mode form, it is not allowed to become large in size and high in cost. It is needless to say that it is also essential to bring parts and circuits constituting the cellular phone into multi-band/multi-mode form if reductions in size and cost of the cellular phone are taken into consideration. That is, even the power control circuit for the above APC needs to be adapted to multi-band/multi-mode form.

On the other hand, when, for example, the sharing of GSM in which a channel band width is 400 kHz and W-CDMA in which a channel band width is 5 MHz is taken into consideration, the channel band widths are widely different from each other in the technique disclosed in the patent document 3. Therefore, circuit design adapted to both systems becomes difficult unavoidably.

An object of the present invention is to provide a power control circuit having a stable high-speed operation or provide a semiconductor device using the same power control circuit or provide a transceiver circuit using the same power control circuit.

According to one aspect of the present invention, for attaining the above object, there is provided a power control circuit that controls a gain of an amplifier in such a manner that output power of the amplifier reaches a desired power value according to a power control signal, comprising: a digital feedback loop which converts a detected signal obtained by detecting a power value of the output power of the amplifier to a digital signal, determines a first differential between the detected signal converted to the digital signal and the power control signal, and converts the first differential to a first analog signal and outputs a first feedback signal; an analog feedback loop which outputs a high frequency element of a second differential between the power control signal converted to a second analog signal and the detected signal as a second feedback signal; and an adder which determines the sum of the first feedback signal and the second feedback signal and outputs a gain control signal for controlling the gain of the amplifier. Since the analog feedback loop does not include a delay based on digital signal processing, it is capable of high-speed operation. Thus, the operation of allowing the power value to converge constantly is principally performed by the digital feedback loop, and the second feedback signal corresponding to the high frequency element of the feedback signal is generated by the analog feedback loop capable of high-speed operation. Therefore, stabilization at the high-speed operation of the power control circuit is enabled. Accordingly, the power control circuit of the present invention can be shared among a plurality of frequency bands and a plurality of systems.

According to another aspect of the present invention, for achieving the above object, there is provided a semiconductor device comprising: a circuit block including, a receiver circuit which amplifies a received first signal; a first frequency conversion circuit which converts the frequency of the first signal of post-amplification outputted from the receiver circuit to output a second signal; a second frequency conversion circuit which inputs a third signal to be transmitted and converts the frequency of the third signal to output a fourth signal; a first amplifier which amplifies the fourth signal outputted from the second frequency conversion circuit and whose gain is controlled by a second power control signal; and the above-mentioned power control circuit which controls output power of an external second amplifier amplifying the fourth signal by use of a first power control signal in such a manner that the output power reaches a desired power value, wherein the circuit block is formed over the same semiconductor substrate. The semiconductor device having the above configuration is equipped with the power control circuit which can be shared among a plurality of frequency bands and a plurality of systems because it is capable of stable high-speed operation. Thus, the use of the semiconductor device of the present invention allows realization of reductions in size and cost of a communication device such as a multi-band/multi-mode-capable cellular phone or the like.

According to a further aspect of the present invention, for attaining the above object, there is provided a transceiver circuit comprising: a circuit block including, a first receiver circuit which amplifies a 1 ath signal of a first communication system, which is received by an antenna; a second receiver circuit which amplifies a 1 bth signal of a second communication system, which is received by the antenna; a first frequency conversion circuit which converts the frequency of the 1 ath or 1 bth signals of post-amplification outputted from the first or second receiver circuits to thereby output a second signal; a second frequency conversion circuit which inputs a 3 ath signal to be transmitted of the first communication system or a 3 bth signal to be transmitted of the second communication system and executes frequency conversion to the same to thereby output a fourth signal; a first amplifier which amplifies the fourth signal outputted from the second frequency conversion circuit and whose gain is controlled by a second power control signal; a second amplifier which power-amplifies the fourth signal of post-amplification outputted from the first amplifier; a detector which detects a power value of an output signal of the second amplifier to output a detected signal; and the above-mentioned power control circuit which controls an output power of the second amplifier by use of a first power control signal in such a manner that the output power reaches a desired power value. The transceiver circuit having the above configuration is equipped with the power control circuit capable of being shared for a plurality of frequency bands and a plurality of systems because it is capable of stable high-speed operation. Accordingly, the use of the transceiver circuit of the present invention allows realization of reductions in size and cost of a communication device such as a multi-band/multi-mode-adaptable cellular phone or the like.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
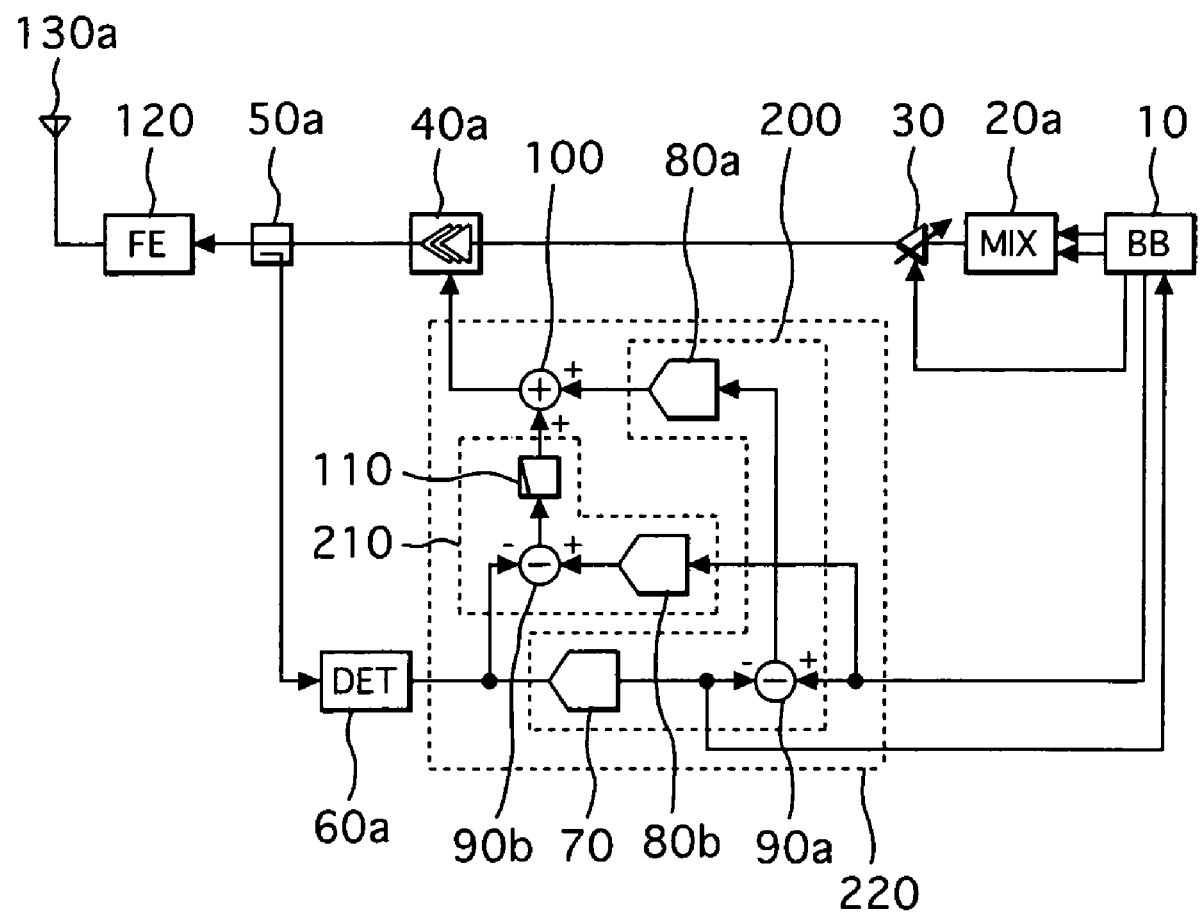
FIG. 1 is a circuit diagram for describing a first embodiment showing a power control circuit of the present invention.

A power control circuit according to the present invention, a semiconductor device and a transceiver circuit using the same will hereinafter be described in detail by reference to several preferred embodiments illustrated in the drawings. Incidentally, components each having the same or similar function are given the same reference numerals in all drawings for describing the embodiments and their repetitive descriptions will therefore be omitted.

First Preferred Embodiment

A first embodiment illustrative of a power control circuit of the present invention is shown in FIG. 1. As one example, a case is indicated, in which the present invention is applied to a cellular phone appropriate to GSM and W-CDMA, in order to simply describe the structure, operation and effects of the power control circuit according to the present embodiment. FIG. 1 is a circuit configuration diagram showing a transmitter block of a cellular phone equipped with the power control circuit according to the present embodiment.

In FIG. 1, reference numeral 10 indicates a base band signal processor (BB), reference numeral 20a indicates a frequency conversion circuit (MIX), reference numeral 30 indicates an available gain amplifier, reference numeral 40a indicates a power amplifier, reference numeral 50a indicates a directional coupler, reference numeral 60a indicates a detector (DET), reference numeral 70 indicates an analog to digital (A/D) converter, reference numerals 80a and 80b indicate digital to analog (D/A) converters, reference numerals 90a and 90b indicate comparators, reference numeral 100 indicates an adder, reference numeral 110 indicates a high pass filter, reference numeral 120 indicates a front-end circuit (FE), and reference numeral 130a indicates an antenna, respectively. The front-end circuit 120 principally comprises high frequency parts such as an antenna switch, a duplexer or diplexer, etc.

In the above configuration, reference numeral 200 indicates a digital feedback loop comprising the A/D converter 70, the comparator (first comparator) 90a and the D/A converter (first D/A converter) 80a. Reference numeral 210 indicates an analog feedback loop comprising the D/A converter (second D/A converter) 80b, the comparator (second comparator) 90b and the high pass filter 110. Further, reference numeral 220 indicates a power control circuit which comprises the digital feedback loop 200, the analog feedback loop 210 and the adder 100.

The operation of the transmitter block of the cellular phone equipped with the power control circuit 220 according to the present embodiment will first be described. Upon the respective modes of GSM and W-CDMA, the frequency of a transmitted signal (third signal) of the base band signal processor 10 is converted to a desired frequency at the frequency conversion circuit 20a, followed by being amplified to desired power by the available gain amplifier 30. Further, it is converted to desired power by the power amplifier 40a, which in turn is transmitted from the antenna 130a via the directional coupler 50a and the front-end circuit 120. The base band signal processor 10 further outputs a digital power control signal (power control signal or first power control signal) detected from a received signal sent from a base station (not shown).

On the other hand, part of the output signal of the power amplifier 40a, which has been taken out by the directional coupler 50a, is inputted to the detector 60a, where it is converted to a voltage value. Although a half wave detector may preferably be convenient for the detector 60a, a full wave detector may be used.

The power control circuit 220 is used when the GSM mode is performed. Part of the output signal of the detector 60a is converted to a digital signal by the A/D converter 70, which in turn is inputted to the comparator 90a. Further, the part of the output signal of the detector 60a is inputted to the comparator 90b.

The comparator 90a outputs a differential between the output signal of the A/D converter 70 and the power control signal outputted from the base band signal processor 10. The output signal of the comparator 90a is converted to an analog signal by the D/A converter 80a, which results in a first feedback signal, after which it is inputted to the adder 100. On the other hand, the comparator 90b outputs a differential between the part of the output signal of the detector 60a and the power control signal outputted from the base band signal processor 10, which has been converted to an analog signal through the D/A converter 80b. The output signal of the comparator 90b is brought to a second feedback signal through the high pass filter 110, which in turn is inputted to the adder 100. The adder 100 outputs the sum of the first feedback signal outputted from the D/A converter 80a and the second feedback signal outputted from the high pass filter 110. The output signal of the adder 100 is applied to a gain control terminal of the power amplifier 40a as a gain control signal (Vapc). With the above circuit configuration, a power value of the output signal of the power amplifier 40a is controlled so as to converge on a value corresponding to the power control signal outputted from the base band signal processor 10.

According to the power control circuit of the present embodiment shown in FIG. 1, since the analog feedback loop 210 is equipped with the high pass filter 110, the signal outputted from the analog feedback loop 210 has a high frequency element alone. Further, since the analog feedback loop 210 does not include a delay produced in the case of execution of digital signal processing, a high speed operation is enabled. Thus, since the operation of allowing the power value to converge constantly is principally performed by the digital feedback loop 200, and the high frequency element of each signal in the power control circuit 220 is fed back by the analog feedback loop 210 capable of high-speed operation, stabilization of the power control circuit 220 is enabled.

Incidentally, when the transmitter block performs the W-CDMA mode, a signal outputted from the detector 60a is converted to a digital signal by the A/D converter 70, which in turn is inputted to the base band signal processor 10. In the case of W-CDMA in this way, the A/D converter 70 of the power control circuit 220 is shared for GSM.

The base band signal processor 10 compares the output signal of the A/D converter 70 and a power control signal detected by a received signal from the corresponding base station and controls the power value of an output signal of the available gain amplifier 30 in such a manner that the power value of an output signal of the power amplifier 40 is brought to a desired value. Since the dynamic range of the power value of a transmitted signal required in W-CDMA is very large like about 70 dB, the power value of an input signal is varied in a state in which a bias point of the power amplifier 40a is held constant, where the W-CDMA mode is performed, whereby the power value of the output signal is determined. With the above circuit configuration, the power value of the output signal of the power amplifier 40a is thus controlled so as to converge on a value corresponding to a power control signal (second power control signal) outputted from the base band signal processor 10. Since the base band signal processor 10 generates a power control signal for the available gain amplifier 30 by digital signal processing in the case of the W-CDMA mode, detailed power control is enabled.

Second Preferred Embodiment

Figure 2A:
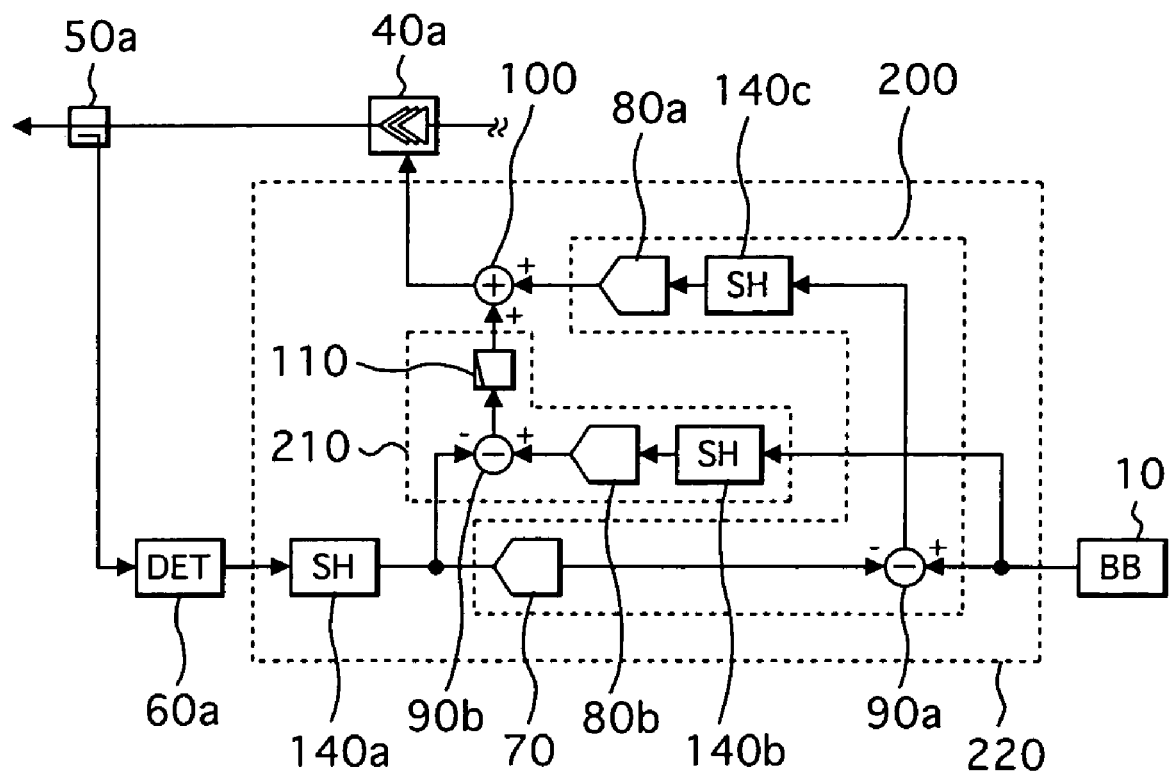
FIG. 2A is a circuit diagram for describing a second embodiment showing a power control circuit of the present invention.

A second embodiment illustrative of a power control circuit of the present invention is shown in FIG. 2A. FIG. 2A is a circuit configuration diagram showing a transmitter block of a cellular phone equipped with the power control circuit according to the present embodiment. The cellular phone, to which the present invention is applied, corresponds even to EDGE in addition to GSM and W-CDMA. Thus, the power control circuit according to the present embodiment is applied to GSM and EDGE modes and serves as a multi-mode power control circuit.

When the transmitter block performs the EDGE mode, its basic operation is similar to the GSM mode in the first embodiment. Points different from the GSM mode will next be explained.

Figure 3:
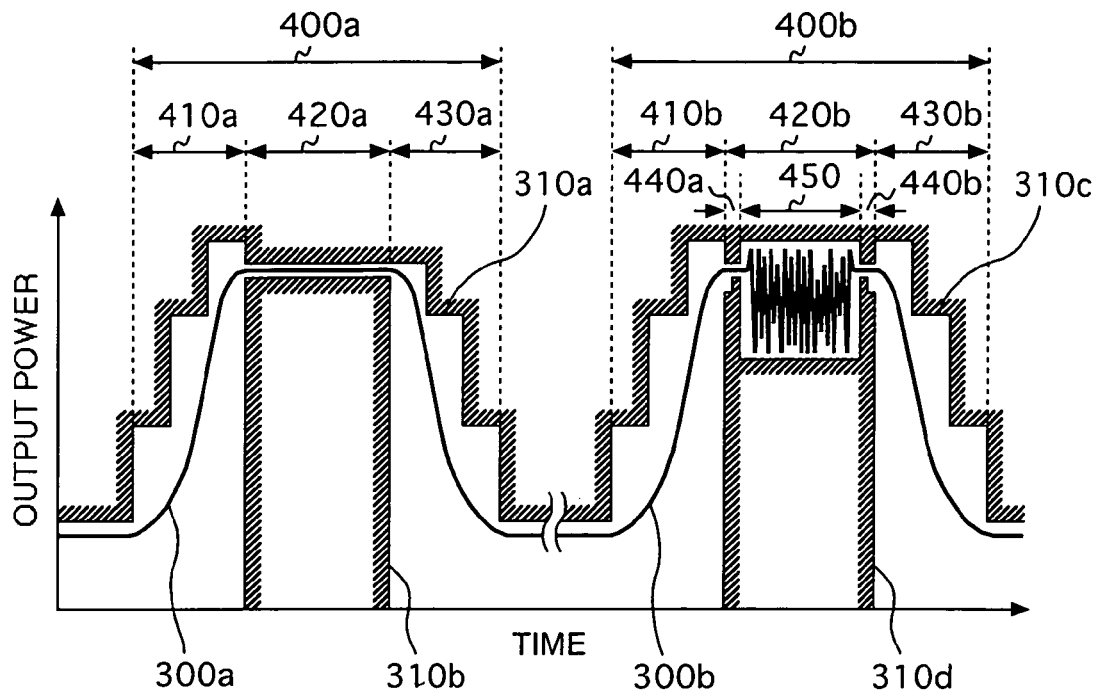
FIG. 3 is a diagram showing examples illustrative of time responses of transmitted signal power value of GSM and EDGE and time masks.

FIG. 3 is a graph showing time responses of a transmitted signal power value transmitted from an antenna 130a and normalized time masks where GSM and EDGE modes are performed.

In FIG. 3, the horizontal axis indicates time, and the vertical axis indicates power value. Reference numeral 300a indicates transmitted signal power transmitted from the antenna 130a in the case of the GSM mode, reference numerals 310a and 310b indicate time masks which define the transmitted signal power transmitted from the antenna 130a in the case of the GSM mode, reference numeral 400a indicates one slot in the case of the GSM mode, reference numeral 410a indicates ramp up, reference numeral 420a indicates a burst, and reference numeral 430a indicates ramp down, respectively. Reference numeral 300b indicates transmitted signal power transmitted from the antenna 130a in the case of the EDGE mode, reference numerals 310c and 310d indicate time masks which define the transmitted signal power transmitted from the antenna 130a in the case of the EDGE mode, reference numeral 400b indicates one slot in the case of the EDGE mode, reference numeral 410b indicates ramp up, reference numeral 420b indicates a burst, and reference numeral 430b indicates ramp down, respectively. Further, reference numerals 440a and 440b respectively indicate buffer periods set to the beginning and end of the burst 420b in the case of the EDGE mode.

When the GSM mode is performed as shown in FIG. 3, the signal transmitted from the antenna 130a is constant power at the burst 420a. Thus, since the power of an output signal of a power amplifier 40a is also constant, the power control circuit 220 is capable of closed loop operation at all times during one slot 400a.

On the other hand, when the EDGE mode is performed, the transmitted signal sent out from the antenna 130a is being amplitude-modulated during a modulated signal output period 450 excluding the buffer periods 440a and 440b of the burst 420b, and hence the envelope of the transmitted signal changes. Therefore, a sample hold function during the modulated signal output period 450 is required. Owing to a gain control voltage held at a constant value during this period, the gain of the power amplifier 40a is kept constant regardless of the change in the envelope of the transmitted signal.

In FIG. 2A, reference numerals 140a, 140b and 140c respectively indicate sample and hold circuits disposed on the output side of a detector 60a, the input side of an A/D converter 80b and the input side of the A/D converter 80a (they corresponds to first, second and third sample and hold circuits respectively).

The operation of the sample hold function in the EDGE mode of the present embodiment will be explained using FIG.

2A. The sample and hold circuits 140a through 140c are first turned off at the ramp up 410b.

Figure 2B:
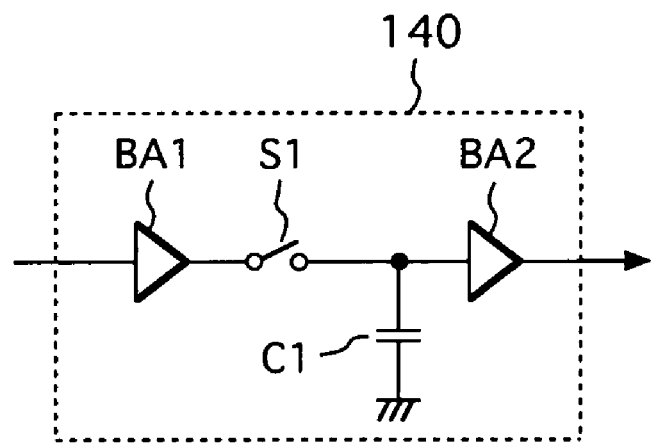
FIG. 2B is a circuit diagram for describing a sample and hold circuit employed in the second embodiment.
Figure 2C:
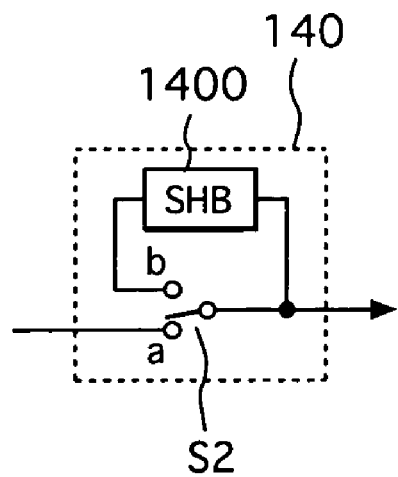
FIG. 2C is another circuit diagram for describing a sample and hold circuit employed in the second embodiment.

Now, in the present specification, the turning off of the sample and hold circuit 140 indicates that a switch S1 shown in FIG. 2B is held on or a switch S2 shown in FIG. 2C is being connected to the side of a terminal a. The turning on of the sample and hold circuit 140 indicates that the switch S1 is held off or the switch S2 is being connected to the side of a terminal b.

In FIG. 2B, BA1 and BA2 indicate buffer amplifiers respectively, and C1 indicates a capacitor. When S1 is ON(i.e., the sample and hold circuit 140 is turned OFF), C1 is charged so that the sample and hold circuit 140 outputs an input signal as it is (sample state). When S1 is OFF (i.e., the sample and hold circuit 140 is turned ON), a signal corresponding to the amount of charge of the capacitor C1 is supplied to the buffer amplifier BA2 (hold state), whereby a sample hold function is realized. On the other hand, a sample and hold circuit body 1400 is of, for example, a one clock delay circuit in FIG. 2C. When S2 is connected to the side of a terminal a (i.e., the sample and hold circuit 140 is turned OFF), the sample and hold circuit 140 outputs an input signal as it is (sample state). When S2 is connected to the side of a terminal b (i.e., the sample and hold circuit 140 is turned ON), the sample and hold circuit 140 always outputs a signal preceding one clock inputted to the sample and hold circuit body 1400 (hold state), whereby a sample hold function is realized.

Thus, when the sample and hold circuits 140a through 140c are turned OFF, FIG. 2A becomes similar to FIG. 1, and the power control circuit 220 is closed loop operated in a manner similar to the GSM mode in such a manner that the power of the output signal of the power amplifier 40a converges on a desired value. Next, the sample and hold circuits 140a through 140c are simultaneously turned ON during the buffer period 440a set to the beginning of the burst 420b so that signal values (voltage values or power value) at the respective sample and hold circuits are memorized and held. Further, the respective sample and hold circuits 140a through 140c respectively output their memorized and held signal values during the modulated signal output period 450. Furthermore, the power value of the output signal of the power amplifier 40a is restored to a value equal to the interval of the buffer period 440a during the buffer period 440b set to the end of the burst 420b (the input signal of the power amplifier 40a is restored to a constant amplitude value). Thereafter, the sample and hold circuits 140a through 140c are simultaneously turned OFF. Finally, the sample and hold circuits 140a through 140c are turned OFF at the ramp down 430b, so that the power control circuit 220 is closed-loop operated in a manner similar to the GSM mode in such a manner that the power value of the output signal of the power amplifier 40a converges on a desired value.

According to the present embodiment, since the sample and hold circuits 140b and 140c are constituted of digital circuits, there is no problem about a sample hold leak. While the sample and hold circuit 140a is configured of an analog circuit, any of the detector 60a, comparator 90b and A/D converter 70 is operated with being inputted with the voltage, and a current flowing into a system is small. Therefore, the deterioration of a sample hold function due to the sample hold leak is low. Thus, the sample hold function substantially free of the sample hold leak can be realized during the modulated signal output period 450 in the EDGE mode owing to the above circuit configuration.

Incidentally, by turning OFF the adder 100 at the ramp down 430b, the power amplifier 40a performs closed-loop operation, whereby the power value of the output signal of the power amplifier 40a may be reduced to a desired value. Alternatively, by turning OFF the D/A converters 80a and 80b, the power amplifier 40a performs open-loop control, whereby the power value may be reduced to a desired power value. Since there is no need to consider spurious generation due to a differential in sample holding value at switching from a sample holding state to a closed loop at the buffer period 440b in this case, design can easily be performed.

As an alternative to the above, the closed loop operation may be applied during the first half of the ramp down 430b and the open loop operation may be selected during the latter half thereof. In this case, the open loop operation makes it possible to allow the power value to converge on a desired value even in the case where the power value does not converge on the desired value due to a loop gain reduction caused by non-linearity of the power amplifier 40a.

Figure 4:
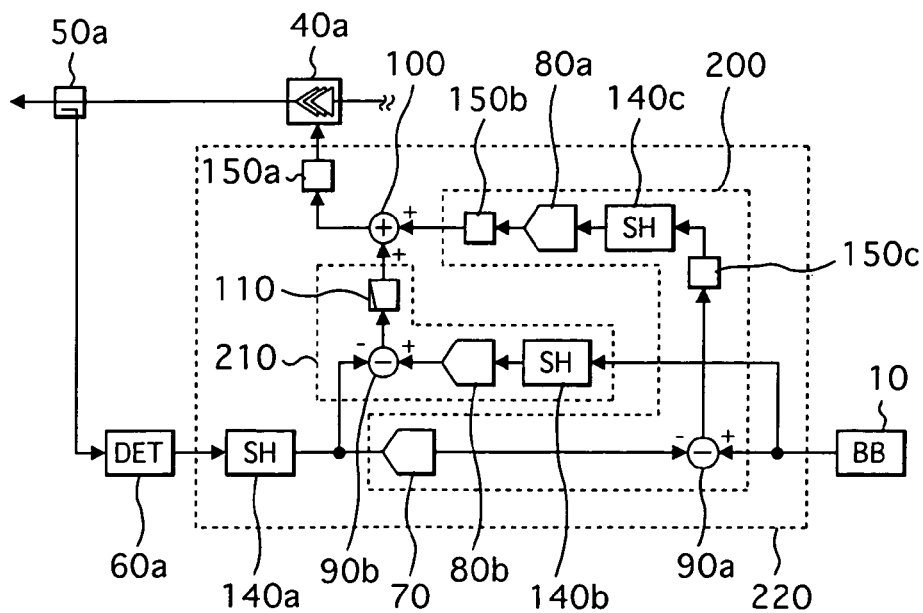
FIG. 4 is another circuit diagram for describing the second embodiment showing the power control circuit of the present invention.

Incidentally, loop filters may suitably be disposed depending upon the characteristic of a closed loop. An example configured in this way is shown in FIG. 4. Loop filters 150a, 150b and 150c are respectively disposed on the output sides of an adder 100, an A/D converter 80a and a comparator 90a.

Furthermore, when the GSM or EDGE mode is performed, the multi-mode power control circuit according to the present embodiment adjusts the gain control voltage of the power amplifier 40a to control the power value of the output signal of the power amplifier 40a. However, the power value of an output signal from a frequency conversion circuit 20a or an available gain amplifier 30 may be adjusted as needed. In this case, such a configuration as to adjust the power value of the output signal from the frequency conversion circuit 20a or the available gain amplifier 30 is newly required. Since, however, the gain of the power amplifier 40a may be fixed, low power consumption and high linearization of the power amplifier 40a are enabled.

Figure 5:
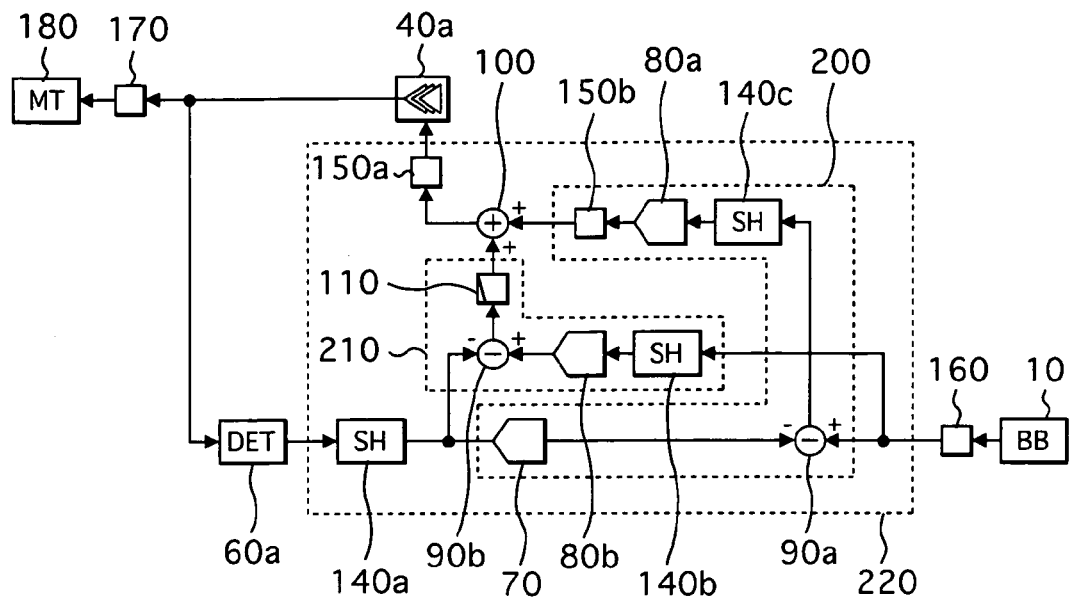
FIG. 5 is a diagram showing a circuit employed in simulation of the power control circuit of the present invention.

The characteristic of the above power control circuit according to the present embodiment was obtained by simulation. FIG. 5 is a circuit diagram for describing the GSM and EDGE modes employed in the simulation.

In FIG. 5, reference numeral 160 indicates a logarithm/antilogarithm conversion function, reference numeral 170 indicates an antilogarithm/logarithm conversion function, and reference numeral 180 indicates a monitor (MT) which detects the power value of a signal outputted from the power amplifier 40a. A function representing the relationship between a gain control voltage and an output voltage with respect to the power amplifier 40a was applied to a ramp signal arbitrarily created by the base band signal processor 10. A low pass filter having a primary transfer function, whose cutoff frequency is 150 kHz, was applied to the loop filter 150a, a lag reed filter having a secondary transfer function, in which a cutoff frequency is 150 kHz and a=3 (a: frequency ratio between a pole having a transfer function and a zero point), was applied to the loop filter 150b, and a high pass filter having a primary transfer function, whose cutoff frequency is 200 kHz, was applied to the high pass filter 110, respectively. Furthermore, the sampling frequency of the A/D converter 70 was set to 25 MHz, a quantizing step was set as 0.2, and the sampling frequencies of the D/A converters 80a and 80b were set to 25 MHz. Incidentally, the detector 60a was assumed to be a diode having a sufficient dynamic range and a linear function was applied thereto. Clock delays based on digital signal processing corresponding to three clocks have been taken into consideration with respect to the A/D converter 70 and the D/A converters 80a and 80b.

Figure 6:
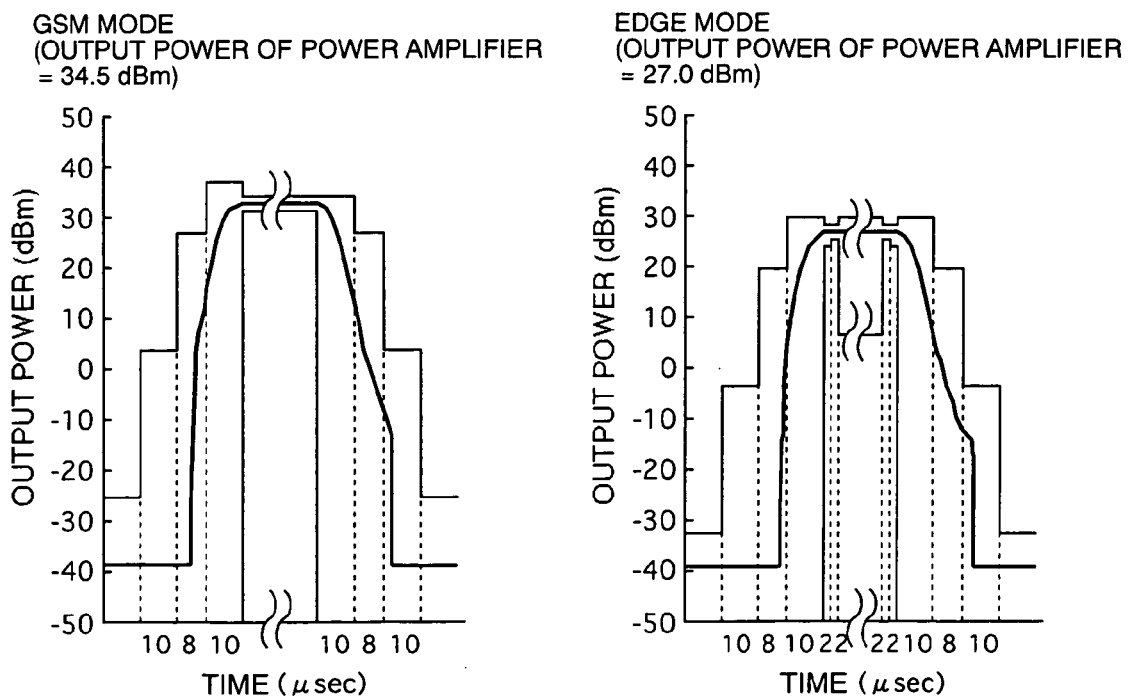
FIG. 6 is a diagram for describing the result of simulation of the power control circuit of the present invention.

FIG. 6 is a graph showing the result of above simulation. As the power of the output signal of the power amplifier 40a, 34.5 dBm is taken as an example in the GSM mode, and 27.0 dBm is taken as an example in the EDGE mode. It was demonstrated from FIG. 6 that control on the power of the output signal of the power amplifier 40a in each of the GSM and EDGE modes satisfied each time mask and the power control circuit 220 was operated stably.

Incidentally, the loop filter may be configured as a digital loop filter 150c in which the transfer function of the loop filter 150b is bilinearly converted in the above simulation. Any of the orders of the transfer functions of the loop filters 150a through 150c and the high pass filter 110 and their cutoff frequencies, the sampling frequency and quantizing step of the A/D converter 70 and the sampling frequencies of the D/A converters 80a and 80b may suitably be changed according to design. Although the number of clocks necessary for each of the A/D converter 70 and the D/A converters 80a and 80b is set to three in the above simulation, the number of clocks is not limited to it. An appropriate number of clocks corresponding to design may be adopted.

Owing to the present embodiment as described above, the power control circuit capable of performing stable power control on each of GSM and EDGE can be realized. Thus, since the power control circuit can be shared for a plurality of systems, the downsizing of a multi-band and multi-mode power control circuit is enabled and its cost reduction is enabled.

Third Preferred Embodiment

Figure 7:
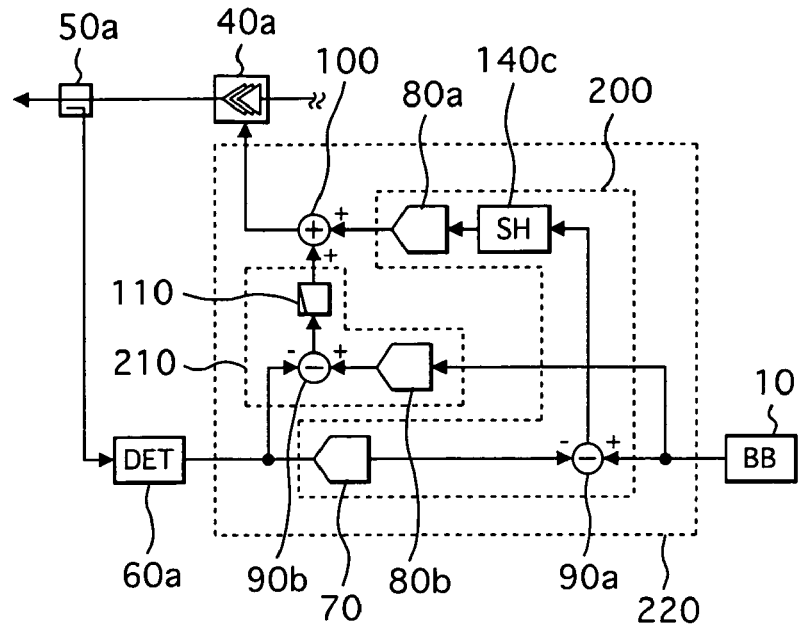
FIG. 7 is a circuit diagram for describing a third embodiment showing a power control circuit of the present invention.

A third embodiment illustrative of a power control circuit of the present invention is shown in FIG. 7. FIG. 7 is a circuit configuration diagram showing a transmitter block of a cellular phone equipped with the power control circuit according to the present embodiment. The cellular phone to which the present invention is applied, is adapted to each of GSM, W-CDMA and EDGE in a manner similar to the second embodiment. The power control circuit according to the present embodiment is used where a comparator 90b can be turned OFF during the modulated signal output period 450. Only a sample and hold circuit 140c is disposed on the input side of an A/D converter 80a. Thus, as compared with the second embodiment, the power control circuit 220 is reduced in size by a reduction in the number of sample and hold circuits.

A basic operation of the power control circuit 220 adapted to GSM and EDGE is similar to the second embodiment but the operation of the sample and hold circuit in the EDGE mode is different therefrom.

The operation of a sample hold function at the EDGE mode of the multi-band and multi-mode power control circuit of the present invention will be explained using FIG. 7. The sample and hold circuit 140c is first turned OFF at the ramp up 410b. The power control circuit 220 performs closed-loop operation in a mode similar to the GSM mode in such a manner that the power value of an output signal of a power amplifier 40a converges on a desired value. Next, the sample and hold circuit 140c is turned ON during the buffer period 440a set to the beginning of the burst 420b to memorize and hold a signal value (voltage value or power value) therein. Simultaneously, the comparator 90b is turned OFF. Further, the sample and hold circuit 140c outputs its memorized and held signal value during the modulated signal output period 450. An output signal value of the comparator 90b is 0. Furthermore, the power value of the output signal of the power amplifier 40a is restored to a value equal to the interval of the buffer period 440a during the buffer period 440b set to the end of the burst 420b (the input signal of the power amplifier 40a is restored to a constant amplitude value). Thereafter, the sample and hold circuit 140c is turned OFF and the comparator 90b is turned ON. Finally, the sample and hold circuit 140c is turned OFF at the ramp down 430b, so that the power control circuit 220 performs closed loop operation in a manner similar to the GSM mode in such a manner that the power value of the output signal of the power amplifier 40a converges on a desired value.

Since the sample and hold circuit 140 is constituted of a digital circuit in the present embodiment, there is no problem of a sample hold leak. Since a high pass filter 110 is disposed between the comparator 90b and an adder 100, each signal that passes through an analog feedback loop 210 results in a high frequency element alone. Therefore, the output signal value (voltage value or power value) of the comparator 90b is approximately 0 where the power value of the output signal of the power amplifier 40a has converged on a constant value. Thus, the output signal value of the analog feedback loop 210 can be retained by turning OFF of the comparator 90b. Accordingly, a sample hold function free of the sample hold leak can be realized during the modulated signal output period 450 in the EDGE mode owing to the above circuit configuration.

Incidentally, the adder 100 is turned OFF with an initial suitable timing of the ramp down 430b to open-loop control the power amplifier 40a, whereby the power value of the output signal of the power amplifier 40a may be reduced to a desired value. Alternatively, the D/A converters 80a and 80b are turned OFF to open-loop control the power amplifier 40a, whereby the power value may be reduced to a desired power value. Since there is no need to consider spurious generation due to a differential in sample holding value at switching from a sample holding state to a closed loop operation at the buffer period 440b in this case, design can be facilitated.

As an alternative to the above, the closed loop operation may be applied during the first half of the ramp down 430b and the open loop operation may be selected during the latter half thereof. In this case, the open loop operation makes it possible to allow the power value to converge on a desired value even in the case where the power value does not converge on the desired value due to a loop gain reduction caused by non-linearity of the power amplifier 40a.

Figure 8:
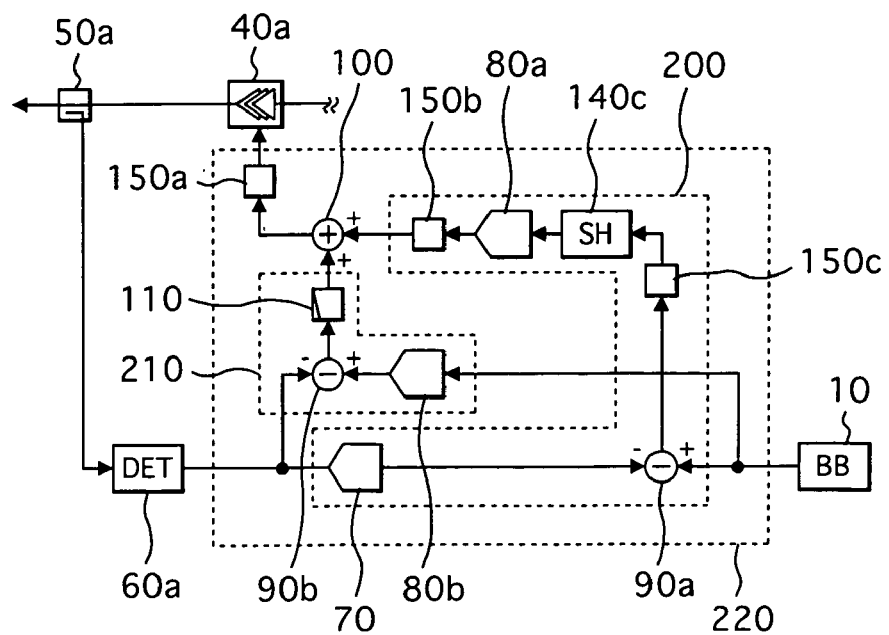
FIG. 8 is another circuit diagram for describing the third embodiment showing the power control circuit of the present invention.

Incidentally, loop filters may suitably be disposed depending upon the characteristic of a closed loop. An example configured in this way is shown in FIG. 8. Loop filters 150a, 150b and 150c are respectively disposed on the output sides of an adder 100, an A/D converter 80a and a comparator 90a. The loop filter 150a may preferably be a low pass filter to suppress switching noise at the turning ON and OFF of the comparator 90b.

Since the signal that passes through the analog feedback loop 210 results in the high frequency element alone as mentioned above, a soft switching operation can be applied to the comparator 90b. Thus, the ON and OFF operations of the comparator 90b may preferably be a soft switching operation switched by taking time without using an instantaneous switching operation.

Fourth Preferred Embodiment

Figure 9:
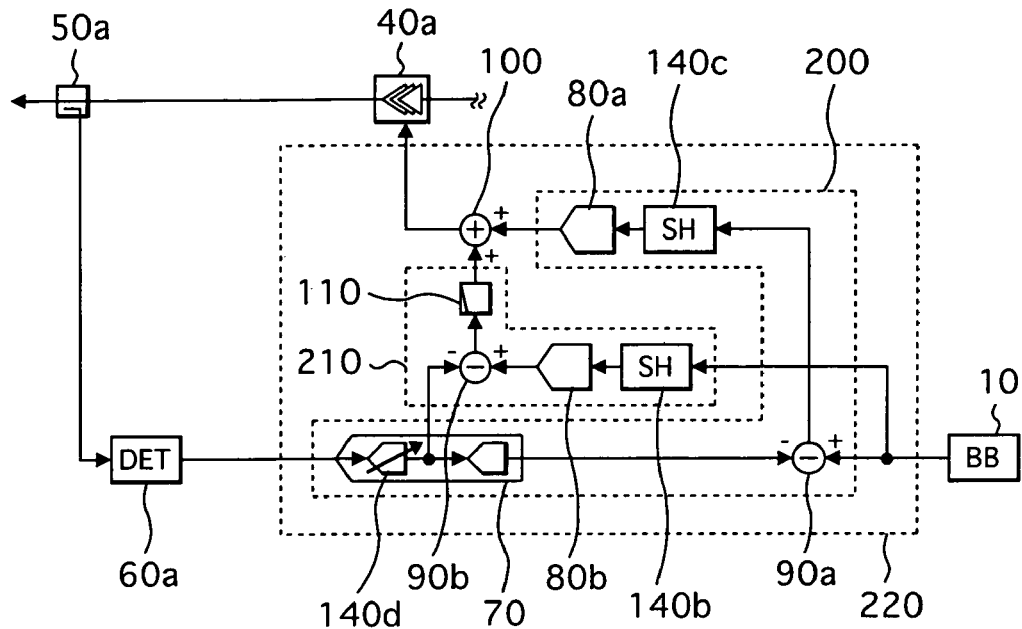
FIG. 9 is another circuit diagram for describing a fourth embodiment showing a power control circuit of the present invention.

A fourth embodiment illustrating a power control circuit of the present invention is shown in FIG. 9. FIG. 9 is a circuit configuration diagram showing a transmitter block of a cellular phone equipped with the power control circuit according to the present embodiment. The power control circuit according to the present embodiment is used where the sample and hold circuit 140a shown in FIG. 2A can be shared with a first-stage sample and hold circuit 140d constituting an A/D converter 70. As compared with the second embodiment, the power control circuit 220 is scaled down by the omission of the sample and hold circuit 140a.

The power control circuit 220 corresponding to GSM and EDGE is similar in basic operation to the second embodiment.

The operation of a sample hold function at the EDGE mode of the present embodiment will be explained using FIG. 9. Sample and hold circuits 140b through 140d are first turned OFF at the ramp up 410b. The power control circuit 220 is operated in a mode similar to the GSM mode in such a manner that the power value of an output signal of a power amplifier 40a converges on a desired value. Next, the sample and hold circuits 140b through 140d are simultaneously turned ON and opened there among during the buffer period 440a set at the beginning of the burst 420b, and memorize and hold signal values (voltage values or power value) at the respective sample and hold circuits therein. Further, the sample and hold circuits 140b through 140d output their memorized and held signal values during the modulated signal output period 450. Furthermore, the power value of an output signal of a power amplifier 40a is restored to a value equal to the interval of the buffer period 440a during the buffer period 440b set at the end of the burst 420b (the input signal of the power amplifier 40a is restored to a constant amplitude value). Thereafter, the sample and hold circuits 140b through 140d are simultaneously turned OFF. Finally, the sample and hold circuits 140b through 140d are turned OFF at the ramp down 430b, so that the power control circuit 220 is operated in the same manner as the GSM mode in such a manner that the power value of the output signal of the power amplifier 40a converges on a desired value.

Since each of the sample and hold circuits 140b through 140d is constituted of a digital circuit in the present embodiment, there is no problem of a sample hold leak.

Incidentally, a loop filter (not shown) may suitably be disposed between an adder 100 and the power amplifier 40a, between the adder 100 and a D/A converter 80a or between a comparator 90a and the sample and hold circuit 140c.

Fifth Preferred Embodiment

Figure 10:
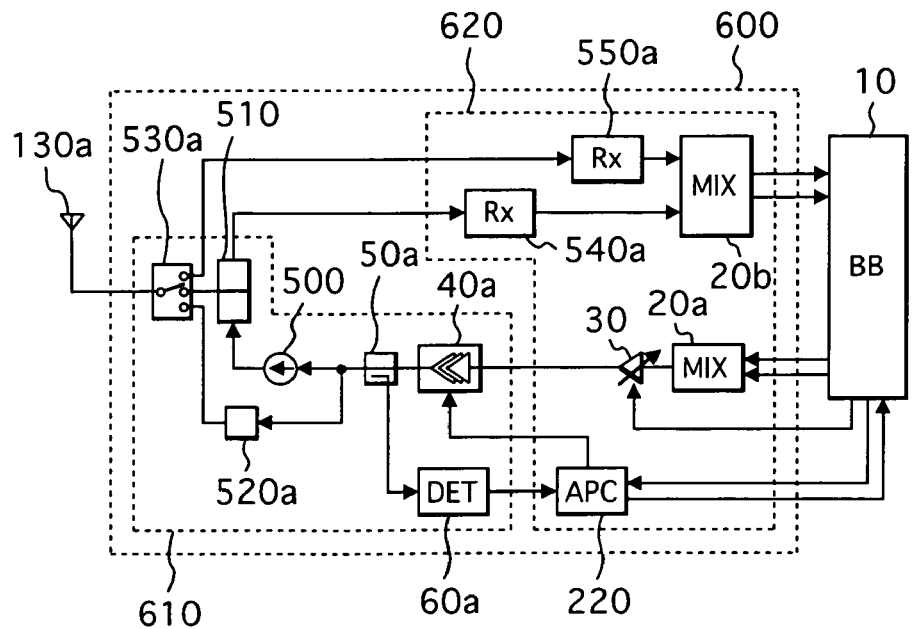
FIG. 10 is a circuit block diagram for describing a fifth embodiment showing a semiconductor device and a transceiver circuit of the present invention.

A fifth embodiment illustrative of a semiconductor device and a transceiver circuit of the present invention is shown in FIG. 10. The present embodiment is used for a cellular phone adapted to, for example, GSM and EDGE (hereinafter abbreviated as "GSM/EDGE") (second communication system) and W-CDMA (first communication system) and is equipped with the power control circuit 220 selected from the second to fourth embodiments.

In FIG. 10, reference numeral 500 indicates an isolator, reference numeral 510 indicates a duplexer, reference numeral 520a indicates a transmitter filter, reference numeral 530a indicates an antenna switch, reference numeral 540a indicates a W-CDMA receiver circuit, reference numeral 550a indicates a GSM/EDGE receiver circuit, and reference numeral 20b indicates a frequency conversion circuit (MIX), respectively. Reference numeral 610 indicates a first circuit block configured including a power amplifier 40a, a directional coupler 50a, a detector 60a, the isolator 500, the duplexer 510, the transmitter filter 520a, and the antenna switch 530a. The first circuit block 610 can be constituted as a first module 610. Further, reference numeral 620 indicates a second circuit block configured including a frequency conversion circuit (first frequency conversion circuit) 20a, the frequency conversion circuit (second frequency conversion circuit) 20b, an available gain amplifier 30, the power control circuit (APC) 220, the W-CDMA receiver circuit (Rx) (first receiver circuit) 540a, and the GSM/EDGE receiver circuit (Rx) (second receiver circuit) 550a. The second circuit block 620 can be configured as a semiconductor device 620 or a second module 620. Reference numeral 600 indicates a third circuit block configured including the first circuit block 610 and the second circuit block 600. The third circuit block 600 corresponds to the transceiver circuit according to the present embodiment and can be configured as a third module 600.

Incidentally, the circuit blocks in the same range, the modules and the semiconductor device will given the same reference numerals as described above in the present specification.

The operation of the transceiver circuit according to the present embodiment will be explained using FIG. 10. An audio signal or a data signal inputted to a base band signal processor 10 is converted to an in-phase component signal (I signal) and a quadrature component signal (Q signal) corresponding to either GSM, EDGE or W-CDMA, after which it is outputted. The I signal and the Q signal are hereinafter abbreviated as "I/Q signals". The I/Q signal for W-CDMA is defined as a 3 ath signal, whereas the I/Q signal for GSM or EDGE is defined as a 3 bth signal. The 3 ath signal or the 3 bth signal is modulated by the frequency conversion circuit (second frequency conversion circuit) 20a, thus resulting in a fourth signal. The fourth signal is inputted to the power amplifier (second amplifier) 40a via the available gain amplifier (first amplifier) 30.

When a W-CDMA mode is performed, the signal amplified by the power amplifier 40a is inputted via the isolator 500, the duplexer 510 and the antenna switch 530a to an antenna 130a from which it is transmitted. On the other hand, when a GSM or EDGE mode is performed, the signal amplified by the power amplifier 40a is inputted via the transmitter filer 520a and the antenna switch 530a to the antenna 130a from which it is transmitted.

A signal (1 ath signal) adapted to W-CDMA, which is received by the antenna 130a, is inputted to the W-CDMA receiver circuit 540a via the antenna switch 530a and the duplexer 510. The W-CDMA receiver circuit 540a amplifies the received signal to a desired power value. Further, the frequency conversion circuit 20b converts the same to an I/Q signal (second signal). The I/Q signal is inputted to the base band signal processor 10 where it is converted to an audio signal or data signal, after which it is outputted therefrom.

On the other hand, a signal (1 bth signal) adapted to GSM or EDGE, which is received by the antenna 130a, is inputted to the GSM/EDGE receiver circuit 550a via the antenna switch 530a. The GSM/EDGE receiver circuit 550a amplifies the received signal to a desired power value. Further, the frequency conversion circuit 20b converts the same to an I/Q signal (second signal). The I/Q signal is inputted to the base band signal processor 10 where it is converted to an audio signal or data signal, after which it is outputted therefrom.

Configurations and operations of the directional coupler 50a and the detector 60a are similar to the second through fourth embodiments. As described above, the power control circuit 220 is equivalent to one selected from the second through fourth embodiments, and its configuration and operation are as already mentioned above.

The cellular phone equipped with the present embodiment is capable of performing operations adapted to GSM/EDGE and W-CDMA by having the configuration and operation referred to above.

Now, the semiconductor device 620 is realized as an RF-IC (Radio Frequency Integrated Circuit) by forming the frequency conversion circuits 20a and 20b, the available gain amplifier 30, the power control circuit 220, the W-CDMA receiver circuit 540*a* and the GSM/EDGE receiver circuit 550*a* over the same semiconductor substrate. Thus, downsizing of the second circuit block 620 and reduction in its cost are achieved. Semiconductor elements that constitute the frequency conversion circuits 20*a* and 20*b* and the like may preferably be BiCMOSs (Bipolar Complementary Metal Oxide Semiconductors) where a reduction in the size thereof, reduction in their power consumption and reduction in their costs are taken into consideration. However, when further reduction in their costs is taken into consideration, the semiconductor elements may preferably be CMOSs (Complementary Metal Oxide Semiconductors).

Incidentally, the power amplifier 40*a* and the detector 60*a* in the first circuit block 610 are formed over the same semiconductor substrate and can be configured as a semiconductor device. Thus, it is possible to allow temperature characteristics of a power amplifying transistor (not shown) that constitutes the power amplifier 40*a*, and that of a diode (not shown) that constitutes the detector 60*a* to coincide with each other, so the detector 60*a* can be brought into high precision. However, the detector 60*a* may be formed on the semiconductor element (CMOS or BiCMOS) containing the frequency conversion circuit 20*a* or the like. In this case, the CMOS (or BiCMOS) brings about advantageous effects in that since a complex arithmetic circuit is easy to form in small size and at low cost, the degree of freedom of a circuit configuration of the detector 60*a* is made wide and the dynamic range of the detector 60*a* can be expanded. Forming the power amplifier 40*a*, directional coupler 50*a*, detector 60*a*, isolator 500, duplexer 510, transmitter filter 520*a* and antenna switch 530*a* on the same module like the first module 610 or the third module 630 makes it possible to arbitrarily set impedance matching between the respective circuit parts, thus enabling reductions in power consumption and size.

Each of semiconductor elements for the semiconductor device equipped with the power amplifier 40*a* and the detector 60*a* may preferably be an HBT (Heterojunction Bipolar Transistor) composed principally of GaAs where a reduction in size, high linearization and an improvement in withstand voltage are taken into consideration. The same semiconductor element may be an HBT, an HEMT (High Electron Mobility Transistor) or an Si-MOSFET (Silicon Metal Oxide Semiconductor Field Effect Transistor) composed principally of SiGe.

Incidentally, the isolator 500 may not be disposed depending upon design for impedance matching between the power amplifier 40*a* and the duplexer 510. As an alternative to the isolator 500, a circulator may be used.

The semiconductor device including the power amplifier 40*a* and the semiconductor device including the frequency conversion unit 20*a* are distinguished as chips different from each other to thereby suppress injection lock due to leakage of a signal from the power amplifier 40*a* to the frequency conversion circuit 20*a*.

Although a description has been made above up to now, of the embodiment in which the present invention is applied to the semiconductor devices and the modules employed in the cellular phone adapted to GSM/EDGE and W-CDMA, the present invention is not limited to the cellular phone. It is needless to say that the present invention can be applied to cellular phones and wireless communication devices adapted to various multi modes. The configurations of the receiver circuits 540*a* and 550*a* are changed in association with the respective multi modes. Incidentally, when the cellular phone is not adapted to W-CDMA, such a constitution as to control the available gain amplifier 30 may be omitted. Further, when the cellular phone is not adapted to EDGE, the power control circuit according to the first embodiment shown in FIG. 1 can be adopted as the power control circuit 220.

Sixth Preferred Embodiment

Figure 11:
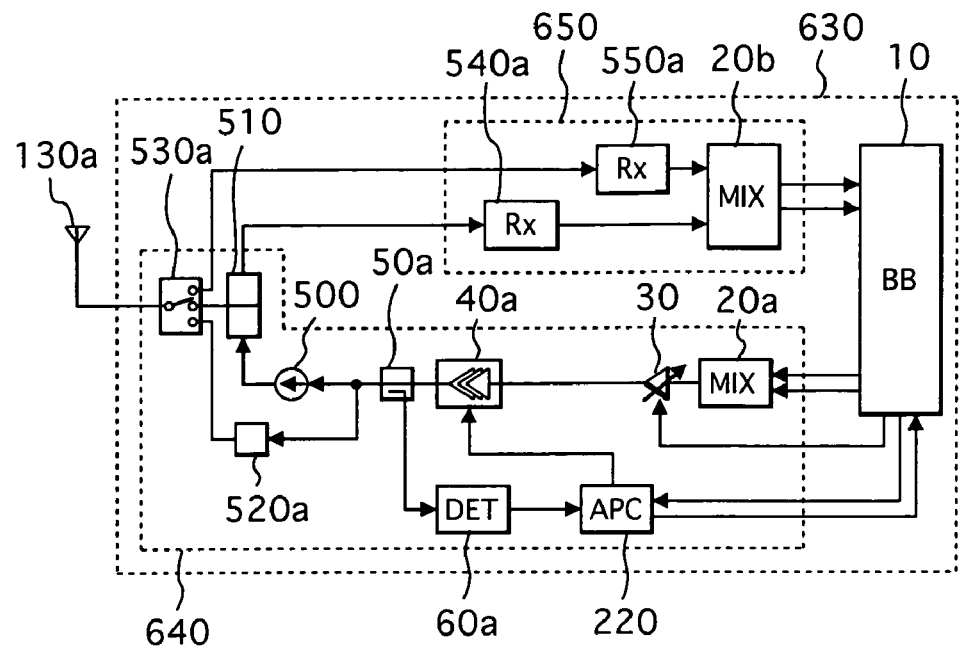
FIG. 11 is a circuit block diagram for describing a sixth embodiment showing a semiconductor device and a transceiver circuit of the present invention.

A sixth embodiment illustrative of a semiconductor device and a transceiver circuit according to the present invention is shown in FIG. 11. In the present embodiment, module configurations are changed with respect to the transceiver circuit according to the fifth embodiment.

A fourth module 630 is configured with a base band signal processor 10 included in the third module 600 shown in FIG. 10.

When the transceiver circuit according to the present embodiment is constituted of two modules, it is divided into a fifth module 640 and a sixth module 650. The fifth module 640 is configured including a frequency conversion circuit 20*a*, an available gain amplifier 30, a power amplifier 40*a*, a directional coupler 50*a*, a detector 60*a*, a power control circuit 220, an isolator 500, a duplexer 510, a transmitter filter 520*a* and an antenna switch 530*a*. The sixth module 650 is configured including a W-CDMA receiver circuit 540*a*, a GSM/EDGE receiver circuit 550*a* and a frequency conversion circuit 20*b*.

The present embodiment is basically similar to the fifth embodiment in operation and effect but the two module configurations are set as the fifth module 640 and the sixth module 650. Thus, the scale of the fifth module 640 becomes large. On the other hand, however, the isolation between a transmitted signal in the frequency conversion circuit 20*a* and a received signal in the frequency conversion circuit 20*b* can be increased, thus making it possible to improve reception sensitivity. Also the receiver circuits are simplified.

Further, when the transceiver circuit of the transceiver circuit type cellular phone is configured by one fourth module 630, the cellular phone can be reduced in size as compared with the case in which it is configured of the modules 600, 610 and 620 or the case in which it is constituted of the modules 640 and 650.

Seventh Preferred Embodiment

Figure 12:
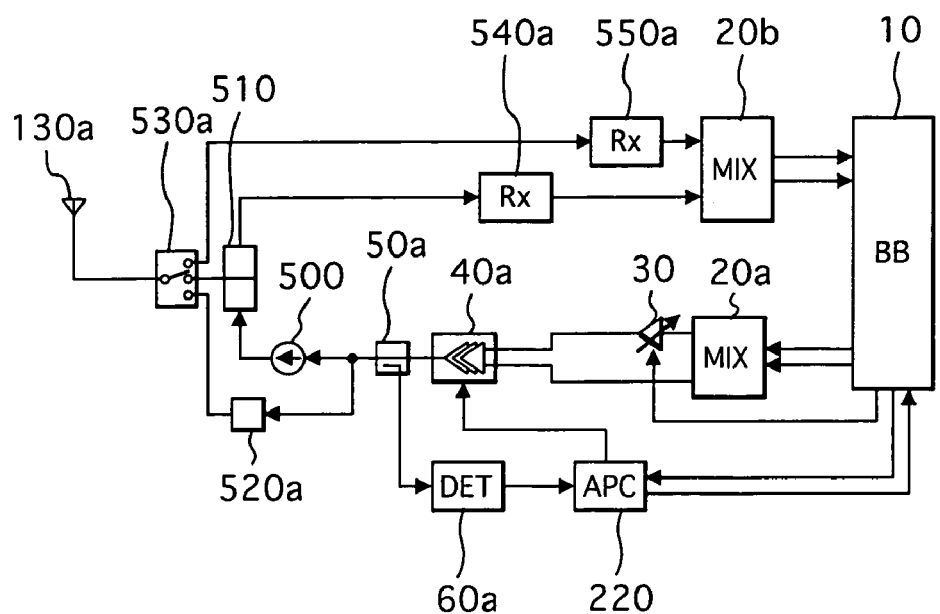
FIG. 12 is a circuit block diagram for describing a seventh embodiment showing a semiconductor device and a transceiver circuit of the present invention.

A seventh embodiment illustrative of a semiconductor device and a transceiver circuit according to the present invention is shown in FIG. 12. In the present embodiment, the configuration set between a frequency conversion circuit 20*a* and a power amplifier 40*a* is changed with respect to the semiconductor device and the transceiver circuit according to each of the fifth and sixth embodiments, and a path including an available gain amplifier 30 and a path excluding it are provided therebetween.

While the present embodiment is basically similar to the fifth and sixth embodiments in operation and effect for transmission/reception, different points thereof are as follows.

In the present embodiment, a signal outputted from the frequency conversion circuit 20*a* is inputted to the power amplifier 40*a* via the available gain amplifier 30 where a W-CDMA mode is performed. However, when a GSM or EDGE mode is performed, the output signal of the frequency conversion circuit 20*a* is inputted to the power amplifier 40*a* without via the available gain amplifier 30. Therefore, the power amplifier 40*a* is inputted with the two signals and hence increases in complexity. However, the frequency conversion circuit 20*a* can be disposed for W-CDMA and GSM/EDGE on an individual basis. Hence, a reduction in power consumption of the frequency conversion circuit 20*a* and the facilitation of its design are enabled.

As the semiconductor device and the modules according to the present embodiment, any of the configurations described in the fifth and sixth embodiments may be selected. That is, in FIG. 12, a semiconductor device 620 or a second module 620 is configured including the frequency conversion circuit 20a, the frequency conversion circuit 20b, the available gain amplifier 30, a power control circuit 220, a W-CDMA receiver circuit 540a and a GSM/EDGE receiver circuit 550a. Also a third module 600 is constituted of respective circuits other than an antenna 130a and a base band signal processor 10. A fourth module 630 is configured including the base band signal processor 10 within the same module. Further, a first module 610 is configured including the power amplifier 40a, a directional coupler 50a, a detector 60a, an isolator 500, a duplexer 510, a transmitter filter 520a and an antenna switch 530a. A fifth module 640 is configured including the frequency conversion circuit 20a, available gain amplifier 30, power amplifier 40a, directional coupler 50a, detector 60a, power control circuit 220, isolator 500, duplexer 510, transmitter filter 520a and antenna switch 530a. The configuration of a fourth module 650 is identical to the sixth embodiment.

Incidentally, no available gain amplifier is disposed in the path adapted to the GSM/EDGE mode in the present embodiment On the contrary, however, an available gain amplifier controlled by the base band signal processor 10 may be disposed in isolation even in the path adapted to the GSM/EDGE mode in a manner similar to the path adapted to the W-CDMA mode. In this case, part of a variable width of the power value of the signal outputted from the frequency conversion circuit 20a, corresponding to GSM/EDGE can be charged to the available gain amplifier. Further, a reduction in power consumption of the frequency conversion circuit 20a, a reduction in its size and the facilitation of its design are made possible.

Eighth Preferred Embodiment

Figure 13:
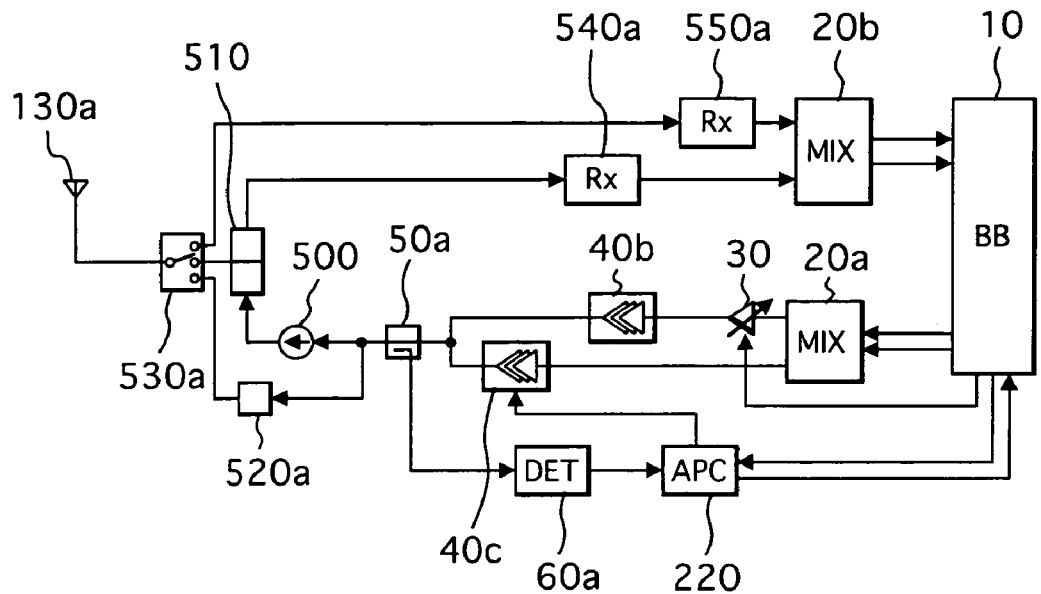
FIG. 13 is a circuit block diagram for describing an eighth embodiment showing a semiconductor device and a transceiver circuit of the present invention.

An eighth embodiment illustrative of a semiconductor device and a transceiver circuit according to the present invention is shown in FIG. 13. In the present embodiment, power amplifiers are disposed every paths extending from a frequency conversion circuit 20a with respect to the semiconductor device and wireless communication modules of the seventh embodiment. In FIG. 13, reference numeral 40b indicates the power amplifier for W-CDMA and reference numeral 40c indicates the power amplifier for GSM/EDGE, respectively. Thus, since the power amplifiers are separately provided for W-CDMA and GSM/EDGE in the present embodiment, a power control circuit 220 performs control only on the power amplifier 40c for GSM/EDGE correspondingly.

The present embodiment is basically similar to the seventh embodiment in operation and effect for transmission/reception. Since, however, the two power amplifiers are disposed in the present embodiment, the present embodiment becomes largish in scale as a whole. On the other hand, however, the power amplifiers 40b and 40c can respectively be designed separately for W-CDMA and GSM/EDGE. Hence, the power amplifiers 40b and 40c can be reduced in power consumption, enhanced in linearity and facilitated in design.

Any of the configurations described in the seventh embodiment may be selected for the semiconductor device and modules according to the present embodiment. That is, in FIG. 13, a third module 600 is constituted of respective circuits other than an antenna 130a and a base band signal processor 10. A fourth module 630 is configured including the base band signal processor 10 within the same module. A first module 610 is configured including the power amplifier 40b, the power amplifier 40c, a directional coupler 50a, a detector 60a, an isolator 500, a duplexer 510, a transmitter filter 520a and an antenna switch 530a. A fifth module 640 is configured including the frequency conversion circuit 20a, an available gain amplifier 30, the power amplifier 40b, the power amplifier 40c, the directional coupler 50a, the detector 60a, the power control circuit 220, the isolator 500, the duplexer 510, the transmitter filter 520a and the antenna switch 530a. The configurations of a semiconductor device 620 or a second module 620, and a sixth module 650 are identical to the seventh embodiment.

Ninth Preferred Embodiment

Figure 14:
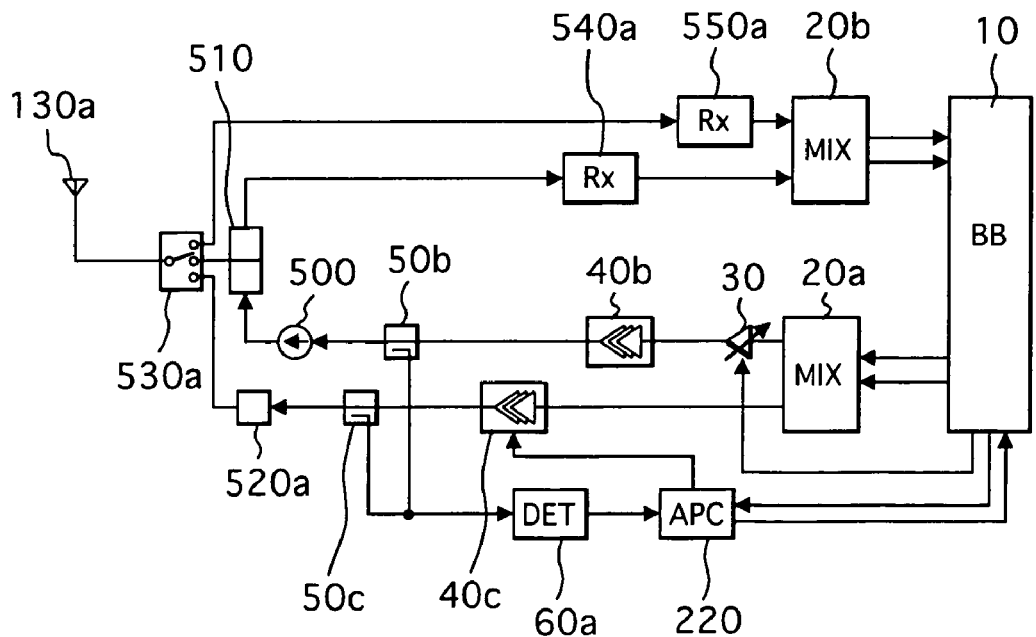
FIG. 14 is a circuit block diagram for describing a ninth embodiment showing a semiconductor device and a transceiver circuit of the present invention.

A ninth embodiment illustrative of a semiconductor device and a transceiver circuit according to the present invention is shown in FIG. 14. In the present embodiment, directional couplers are respectively provided for power amplifiers 40b and 40c with respect to the semiconductor device and the transceiver circuit according to the eighth embodiment. In FIG. 14, reference numeral 50b indicates the directional coupler disposed between the power amplifier 40b for W-CDMA and an isolator 500, and reference numeral 50c indicates the directional coupler disposed between the power amplifier 40c for GSM/EDGE and a transmitter filter 520a, respectively. With such a configuration, an independent path is formed for W-CDMA between a frequency conversion circuit 20a and a duplexer 510, and an independent path is formed for GSM/EDGE between the frequency conversion circuit 20a and an antenna switch 530a.

The present embodiment is basically similar to the eighth embodiment in operation and effect for transmission/reception. Since, however, the paths on the transmitting side are separately provided for W-CDMA and GSM/EDGE in the present embodiment, the present embodiment becomes slightly complex in configuration as a whole. On the contrary, however, the frequency conversion circuit 20a can be disposed for W-CDMA and GSM/EDGE on an individual basis. Hence, the frequency conversion circuit 20a can be reduced in power consumption and facilitated in design. Further, circuits extending from the power amplifiers 40b and 40c to an antenna 130a can individually be designed for W-CDMA and GSM/EDGE. As compared with the eighth embodiment, the power amplifiers 40b and 40c can be reduced in power consumption, enhanced in linearity and facilitated in design.

Any of the configurations described in the eighth embodiment may be selected for the semiconductor device and modules according to the present embodiment. That is, in FIG. 14, a third module 600 is constituted of respective circuits other than the antenna 130a and base band signal processor 10. A fourth module 630 is configured including the base band signal processor 10 within the same module. A first module 610 is configured including the power amplifier 40b, power amplifier 40c, directional coupler 50b, directional coupler 50c, detector 60a, isolator 500, duplexer 510, transmitter filter 520a and antenna switch 530a. Further, a fifth module 640 is configured including the frequency conversion circuit 20a, available gain amplifier 30, power amplifier 40b, power amplifier 40c, directional coupler 50b, directional coupler 50c, detector 60a, power control circuit 220, isolator 500, duplexer 510, transmitter filter 520a and antenna switch 530a. The configurations of a semiconductor device 620 or a second module 620, and a sixth module 650 are identical to the seventh embodiment.

Tenth Preferred Embodiment

Figure 15:
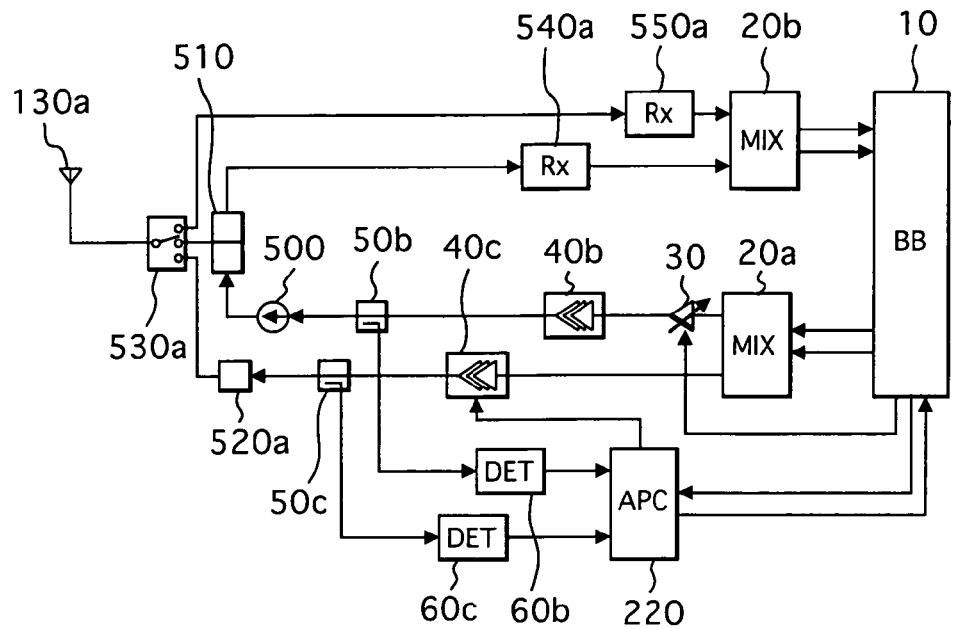
FIG. 15 is a circuit block diagram for describing a tenth embodiment showing a semiconductor device and a transceiver circuit of the present invention.

A tenth embodiment illustrative of a semiconductor device and a transceiver circuit according to the present invention is shown in FIG. 15. In the present embodiment, detectors are respectively provided for directional couplers 50b and 50c with the semiconductor device and transceiver circuit according to the ninth embodiment. In FIG. 15, reference numeral 60b indicates the detector for W-CDMA disposed between the directional coupler 50b and a power control circuit 220, and reference numeral 60c indicates the detector for GSM/EDGE disposed between the directional coupler 50c and the power control circuit 220, respectively.

The present embodiment is basically similar to the ninth embodiment in operation and effect for transmission/reception. Since, however, the detectors 60b and 60c are individually provided for W-CDMA and GSM/EDGE in the present embodiment, the present embodiment becomes slightly complex in configuration as a whole. On the contrary, however, the detectors 60b and 60c can individually be designed for W-CDMA and GSM/EDGE and hence the detectors can be facilitated in design.

Any of the configurations described in the ninth embodiment may be selected for the semiconductor device and modules according to the present embodiment. That is, in FIG. 15, a third module 600 is constituted of respective circuits other than the antenna 130a and base band signal processor 10. A fourth module 630 is configured including the base band signal processor 10 within the same module. A first module 610 is configured including the power amplifier 40b, power amplifier 40c, directional coupler 50b, directional coupler 50c, detector 60b, detector 60c, isolator 500, duplexer 510, transmitter filter 520a and antenna switch 530a. Further, a fifth module 640 is configured including the frequency conversion circuit 20a, available gain amplifier 30, power amplifier 40b, power amplifier 40c, directional coupler 50b, directional coupler 50c, detector 60b, detector 60c, power control circuit 220, isolator 500, duplexer 510, transmitter filter 520a and antenna switch 530a. The configurations of a semiconductor device 620 or a second module 620, and a sixth module 650 are identical to the seventh embodiment.

Eleventh Preferred Embodiment

Figure 16:
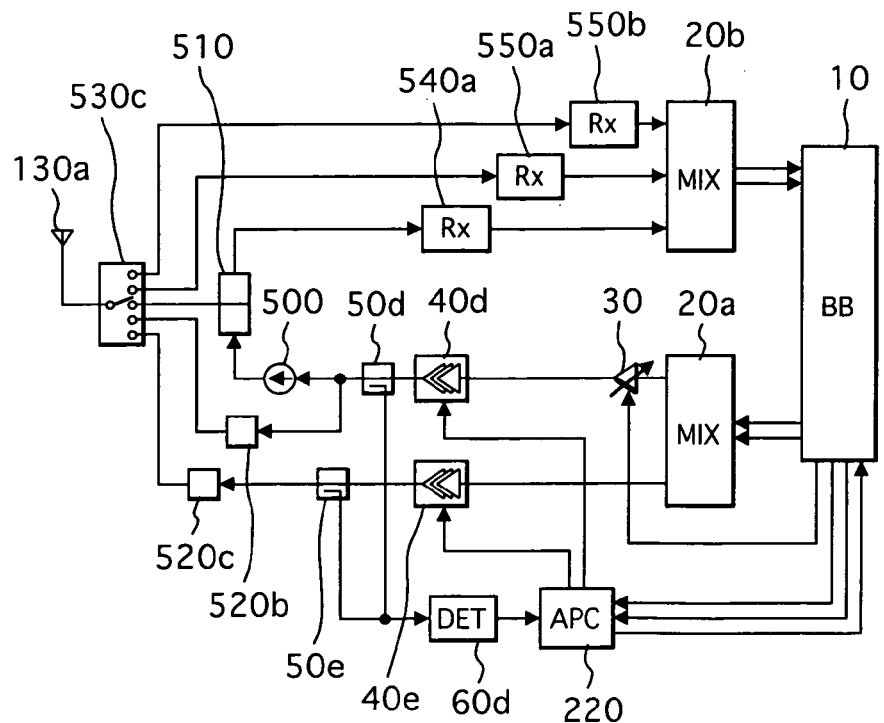
FIG. 16 is a circuit block diagram for describing an eleventh embodiment showing a semiconductor device and a transceiver circuit of the present invention.

An eleventh embodiment illustrative of a semiconductor device and a transceiver circuit according to the present invention is shown in FIG. 16. The present embodiment is used for a cellular phone adapted to respective systems of low band GSM, low band EDGE, high band GSM, high band EDGE and W-CDMA and is equipped with the power control circuit 220 selected from the second through fourth embodiments. The frequencies lying in a low band and a high band are as mentioned above, that is, the low band is an 800 to 900 MHz band, and the high band is a 1800 to 1900 MHz band. Further, the frequency for W-CDMA is set to an 1800 to 1900 MHz band in consideration of simplification of description.

In FIG. 16, reference numeral 40d indicates a power amplifier for W-CDMA and high band GSM/EDGE, reference numeral 40e indicates a power amplifier for low band GSM/EDGE, reference numerals 50d and 50e indicate directional couplers, reference numeral 60d indicates a detector, reference numeral 520b indicates a transmitter filter adapted to the high band GSM/EDGE, reference numeral 520c indicates a transmitter filter adapted to the low band GSM/EDGE, reference numeral 530c indicates an antenna switch, reference numeral 550a indicates a high band GSM/EDGE receiver circuit, and reference numeral 550b indicates a low band GSM/EDGE receiver circuit, respectively.

The operation of the transceiver circuit according to the present embodiment will be explained using FIG. 16. An audio signal or a data signal inputted to a base band signal processor 10 is converted to I/Q signals adapted to any of the systems of the low band GSM, low band EDGE, high band GSM, high band EDGE and W-CDMA, after which they are outputted therefrom and modulated at a frequency conversion circuit 20a.

When a high band GSM mode, a high band EDGE mode or a W-CDMA mode is performed, the output signal of the frequency conversion circuit 20a is inputted to the power amplifier 40d via an available gain amplifier 30. Further, when the W-CDMA mode is performed, the signal amplified by the power amplifier 40d is inputted via an isolator 500, a duplexer 510 and the antenna switch 530c to an antenna 130a from which it is transmitted. On the other hand, when the high band GSM mode or the high band EDGE mode is performed, the signal amplified by the power amplifier 40d is inputted via the transmitter filter 520b and the antenna switch 530c to the antenna 130a from which it is transmitted.

On the other hand, when a low band GSM mode or a low band EDGE mode is performed, the output signal of the frequency conversion circuit 20a is inputted to the power amplifier 40e where it is amplified, after which it is inputted via the directional coupler 50e, the transmitter filter 520c and the antenna switch 530c to the antenna 130a from which it is transmitted.

A W-CDMA-based received signal received at the antenna 130a is inputted via the antenna switch 530c and the duplexer 510 to a W-CDMA receiver circuit 540a where it is amplified to a desired power value and further converted to I/Q signals at a frequency conversion circuit 20b. The I/Q signals are inputted to the base band signal processor 10 where they are converted to an audio signal or a data signal, after which it is outputted therefrom.

On the other hand, a high band GSM-based or a high band EDGE-based received signal received at the antenna 130a is inputted via the antenna switch 530c to the high band GSM/EDGE receiver circuit 550a where it is amplified to a desired power value and further converted to I/Q signals at the frequency conversion circuit 20b. The I/Q signals are inputted to the base band signal processor 10 where they are converted to an audio signal or a data signal, after which it is outputted therefrom.

Similarly, a low band GSM-based or a low band EDGE-based received signal received at the antenna 130a is inputted via the antenna switch 530c to the low band GSM/EDGE receiver circuit 550b where it is amplified to a desired power value and further converted to I/Q signals at the frequency conversion circuit 20b. The I/O signals are inputted to the base band signal processor 10 where they are converted to an audio signal or a data signal, after which it is outputted therefrom.

The directional couplers 50d and 50e and the detector 60d are similar to those in the first through tenth embodiments in configuration and operation. The configuration and operation of the power control circuit 220 may select any of those employed in the second through fourth embodiments.

According to the transceiver circuit of the cellular phone having the multi-band and multi-mode power control circuit corresponding to one embodiment of the present invention shown in FIG. 16, the modes adapted to the low band GSM, low band EDGE, high band GSM, high band EDGE and W-CDMA are made possible with the configurations and operations referred to above, and hence the transceiver circuit can be brought into multi-band/multi-mode form.

Incidentally, although the configurations of circuit blocks adapted to the high band GSM, high band EDGE and W-CDMA, in the transceiver circuit according to the present embodiment are set similar to the fifth embodiment, the present embodiment is not limited to them. Any of other sixth through tenth embodiments may be selected.

As the semiconductor device and modules according to the present embodiment, any of the configurations described in the fifth and sixth embodiments may be selected. That is, in FIG. 16, a semiconductor device 620 or a second module 620 is configured including the frequency conversion circuit 20a, frequency conversion circuit 20b, available gain amplifier 30, power control circuit 220, W-CDMA receiver circuit 540a, high band GSM/EDGE receiver circuit 550a and low band GSM/EDGE receiver circuit 550b. Also a third module 600 is constituted of respective circuits other than the antenna 130a and the base band signal processor 10. A fourth module 630 is configured including the base band signal processor 10 within the same module. Further, a first module 610 is configured including the power amplifier 40d, power amplifier 40e, directional coupler 50d, directional coupler 50e, detector 60d, isolator 500, duplexer 510, transmitter filter 520b, transmitter filter 520c and antenna switch 530c. A fifth module 640 is configured including the frequency conversion circuit 20a, available gain amplifier 30, power amplifier 40d, power amplifier 40e, directional coupler 50d, directional coupler 50e, detector 60d, power control circuit 220, isolator 500, duplexer 510, transmitter filter 520b, transmitter filter 520c and antenna switch 530c. A fourth module 650 is configured including the frequency conversion circuit 20b, W-CDMA receiver circuit 540a, high band GSM/EDGE receiver circuit 550a and low band GSM/EDGE receiver circuit 550b.

The present embodiment shows an example in which the present invention is applied to a cellular phone of 3-frequency bands (3 bands) and 3 systems (3 modes) adapted to the low band GSM, low band EDGE, high band GSM, high band EDGE and W-CDMA. However, the number of the frequency bands and the number of the systems to which the present invention is applied, are not limited to above, and an arbitrary number of bands and an arbitrary number of systems may be adopted.

Twelfth Preferred Embodiment

Figure 17A:
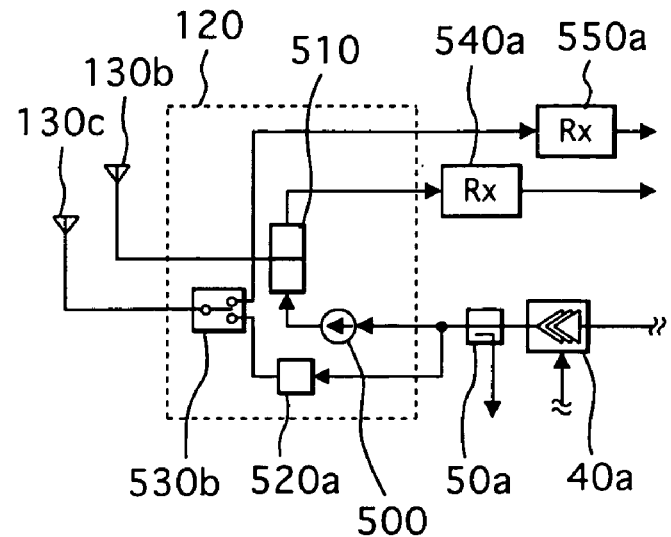
FIG. 17A is a circuit block diagram for describing a twelfth embodiment showing a semiconductor device and a transceiver circuit of the present invention.
Figure 17B:
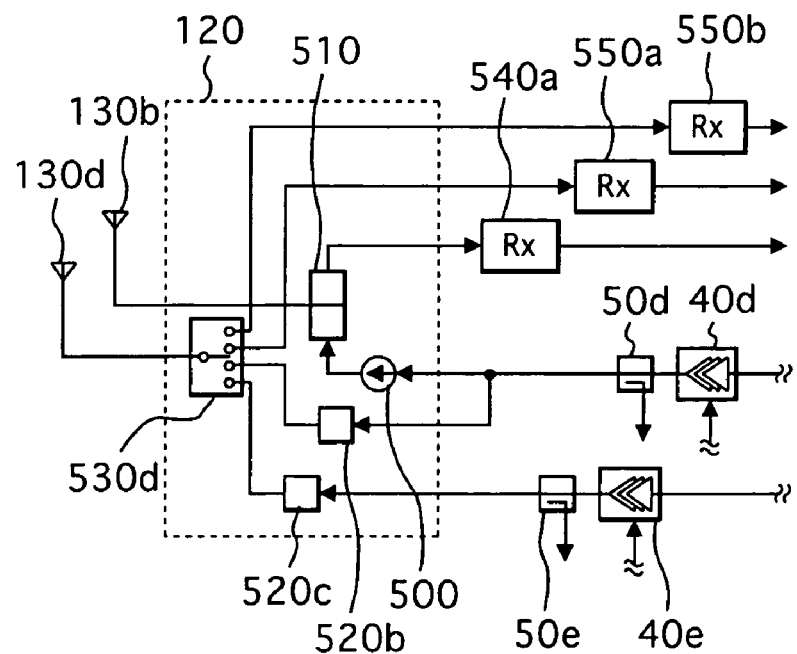
FIG. 17B is another circuit block diagram for describing the twelfth embodiment showing the semiconductor device and the transceiver circuit of the present invention.

A twelfth embodiment illustrative of a semiconductor device and a transceiver circuit according to the present invention is shown in each of FIGS. 17A and 17B. Antennas are separately provided for W-CDMA and GSM/EDGE in the present embodiment.

In FIG. 17A, reference numeral 530b indicates an antenna switch, reference numeral 130b indicates a W-CDMA antenna, and reference numeral 130c indicates a GSM/EDGE antenna, respectively. In FIG. 17B, reference numeral 530d indicates an antenna switch and reference numeral 130d indicates an antenna shared for high band GSM/EDGE and low band GSM/EDGE, respectively.

In FIG. 17A, the transceiver circuit according to the present embodiment, whose overall configuration is not shown in the drawing, is constituted similarly to the fifth embodiment to provide simplification of explanation. In FIG. 17B, the transceiver circuit whose overall configuration is not shown in the drawing, is constituted similarly to the eleventh embodiment for simplification of explanation.

An antenna peripheral circuit 120 of the present embodiment, which is shown in FIG. 17A, is different from the fifth through tenth embodiments in that it includes the antenna 130b connected to its corresponding duplexer 510 and the antenna 130c connected to the antenna switch 530b.

An antenna peripheral circuit 120 of the present invention, which is shown in FIG. 17B, is different from the eleventh embodiment in that it includes the antenna 130b connected to its corresponding duplexer 510 and the antenna 130d connected to the antenna switch 530d.

The operation of the antenna peripheral circuit 120 of the present embodiment, which is shown in FIG. 17A, will be explained.

When a W-CDMA mode is performed, a W-CDMA-based signal inputted to an isolator 500 is inputted via the duplexer 510 to the antenna 130b from which it is transmitted. A W-CDMA-based received signal received at the antenna 130b is inputted to its corresponding W-CDMA receiver circuit 540a via the duplexer 510.

On the other hand, when a GSM or EDGE mode is performed, a GSM or EDGE-based signal inputted to a transmitter filter 520a is transmitted from the antenna 130c through the antenna switch 530b. A GSM or EDGE-based received signal received at the antenna 130c is inputted to its corresponding GSM or EDGE receiver circuit 550a via the antenna switch 530b.

The operation of the antenna peripheral circuit 120 of the present embodiment, which is shown in FIG. 17B, will be described.

When a W-CDMA mode is performed, its operation is similar to that of the antenna peripheral circuit 120 shown in FIG. 17A.

On the other hand, when a high band GSM mode or a high band EDGE mode is performed, a GSM or EDGE-based signal inputted to its corresponding transmitter filter 520b is transmitted from the antenna 130d via the antenna switch 530d. A high band GSM or high-band EDGE-based received signal received at the antenna 130d is inputted to its corresponding high band GSM/EDGE receiver circuit 550a via the antenna switch 530d.

Further, when a low band GSM mode or a low band EDGE mode is performed, a GSM or EDGE-based signal inputted to its corresponding transmitter filter 520c is transmitted from the antenna 130d via the antenna switch 530d. A low band GSM or low band EDGE-based received signal received at the antenna 130d is inputted to its corresponding low band GSM/EDGE receiver circuit 550b via the antenna switch 530d.

According to the present embodiment, since a signal outputted from a power amplifier 40a is transmitted from the antenna 130b without via the antenna switch where the W-CDMA mode is performed, a circuit loss produced between the power amplifier 40a and the antenna 130b can be reduced and hence the power amplifier 40a can be reduced in power consumption, size and cost.

Incidentally, although the transceiver circuit 120 of the present embodiment unillustrated as to its overall configuration is made similar to the fifth embodiment in FIG. 17A, the present invention is not limited to it. Any of the fifth through tenth embodiments may be selected. Although the constitutions of circuit blocks adapted to high band GSM, high band EDGE and W-CDMA in the transceiver circuit 120 of the present embodiment whose overall configuration is not shown in FIG. 17B, are made similar to part of the circuit according to the fourth embodiment, the present invention is not limited to it, and any of the fifth through tenth embodiments may be selected.

Thirteenth Preferred Embodiment

Figure 18:
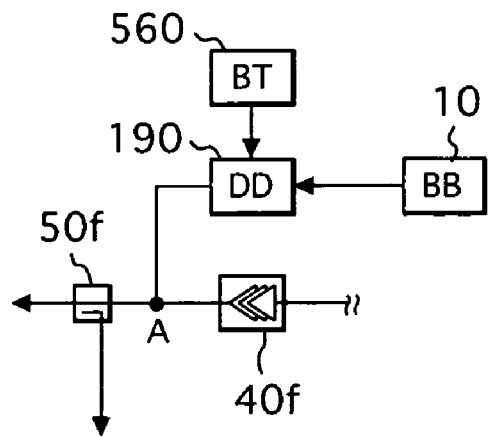
FIG. 18 is a circuit block diagram for describing a thirteenth embodiment showing a semiconductor device and a transceiver circuit of the present invention.

A thirteenth embodiment illustrative of a semiconductor device and a transceiver circuit according to the present invention is shown in FIG. 18. In the present embodiment, a circuit for adjusting a power supply voltage of a power amplifier 40 is added.

In FIG. 18, reference numeral 560 indicates a battery (BT), reference numeral 190 indicates a DC-DC converter (DD), reference numeral 40f indicates a power amplifier and reference numeral 50f indicates a directional coupler, respectively.

In FIG. 18, any of the fifth through twelfth embodiments may be selected for the transceiver circuit of the present embodiment whose overall is not shown in the drawing.

The operation of adjusting the power supply voltage of the power amplifier in the transceiver circuit according to the present embodiment will be explained.

A voltage supplied from the battery 560 is inputted to the DC-DC converter 190 where it is converted to a desired voltage value, which in turn is applied to a power supply voltage terminal (point A in FIG. 18) of the power amplifier 40f. A voltage transfer ratio of the DC-DC converter 190 is adjusted based on a control signal from a base band signal processor 10. The power supply voltage terminal A serves as a collector where a power amplifying transistor that constitutes the power amplifier 40f is configured of a bipolar transistor such as an HBT. When the power amplifying transistor is constituted of a field effect transistor such as a MOSFET, an HEMT or the like, the power supply voltage terminal A serves as a drain.

In general, the output power of a transistor depends upon input power, a gain adjustment or control voltage or current, load impedance and a power supply voltage.

Thus, according to the present embodiment, the power value of a signal outputted from the power amplifier 40f can be controlled in further detail as compared with the first through twelfth embodiments.

A power supply voltage is applied to elements for feeding back and adjusting the output signal taken out at the directional coupler 50f in addition to input power and a gain control voltage. Hence the number of elements increases. Therefore, the degree of freedom of a power control method is made wide, and the facilitation of design and an improvement in control accuracy are hence enabled.

Furthermore, since it is possible to reduce power consumption of the power amplifier for supplying equivalent output power by adjusting or controlling the power supply voltage, power consumption of the power amplifier 40f can be reduced.

Fourteenth Preferred Embodiment

Figure 19:
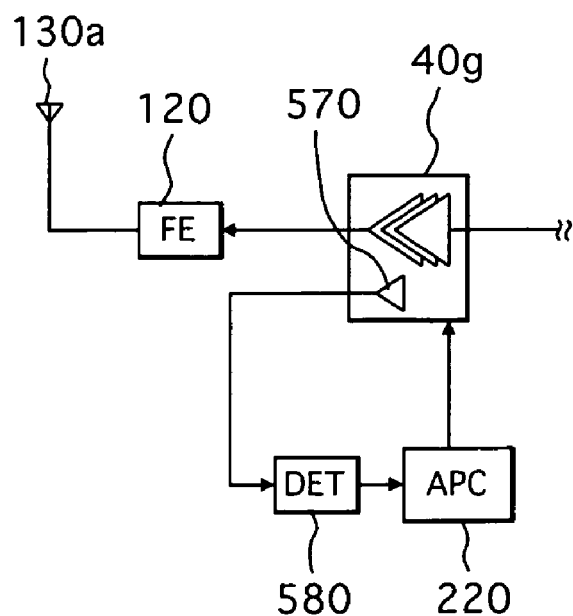
FIG. 19 is a circuit block diagram for describing a fourteenth embodiment showing a semiconductor device and a transceiver circuit of the present invention.

A fourteenth embodiment illustrative of a semiconductor device and a transceiver circuit according to the present invention is shown in FIG. 19. Instead of obtaining the signal inputted to the power control circuit 220 by detecting the output signal of the power amplifier 40 in the case of the first through thirteenth embodiments, the present embodiment has changed a detecting method in such a manner that an input signal is obtained by detecting current consumption of the power amplifier 40.

In FIG. 19, reference numeral 40g indicates a power amplifier, reference numeral 570 indicates a replica transistor which detects current consumption of the power amplifier 40g and reference numeral 580 indicates a current detector which detects current consumption of the replica transistor 570 and converts it to a voltage.

Incidentally, any of the first through fourth embodiments may be selected for the configuration and operation of the power control circuit 220. In FIG. 19, any of the fifth through thirteenth embodiments may be selected for the transceiver circuit of the present embodiment whose whole span is not shown in the drawing.

The operation of detecting the current of the power amplifier in the transceiver circuit according to the present embodiment will be explained.

In general, the output power of a transistor and its collector current (drain current in the case of an FET) have a correlation therebetween. Therefore, the output power of the power amplifier can be detected by detecting current consumption of a final-stage power amplifying transistor that constitutes the power amplifier. However, the final-stage power amplifying transistor is assumed to be a final-stage power amplifying transistor for GSM, for example. When a power supply voltage is set to 3.5 V, output power is set to 35 dBm, power gain is set to 10 dB, and power added efficiency is set to 60%, current consumption results in about 1.5A and hence the current capacity of the current detector becomes very large. When a resistor is inserted in series with a collector wiring to detect the collector current of the power amplifying transistor, a problem arises in that the performance of the power amplifier is degraded due to the resistor.

Therefore, a replica transistor of a 1/n size of the power amplifying transistor is disposed near above a semiconductor element equivalent to the power amplifying transistor, and current consumption of the replica transistor is detected. Since the current consumption of the replica transistor becomes 1/n of the current consumption of the power amplifying transistor, the current capacity of the current detector can be designed low. Since this does not influence the power amplifying transistor, the degradation of the performance of the power amplifier can be suppressed.

On the basis of such principle as described above, the current consumption of the replica transistor 570 is detected by the current detector 580, where it is converted to a voltage corresponding to the power value of a signal outputted from the power amplifier 40g. Any of the first through fourth embodiments may be selected for the operation of the power control circuit 220 inputted with the output signal of the current detector 580.

According to the present embodiment, the power value of the output signal of the power amplifier 40g can be detected by the replica transistor 570 generally smaller than a directional coupler in size. Therefore, a transmitter circuit of a cellular phone can be reduced in size and cost.

Fifteenth Preferred Embodiment

Figure 20:
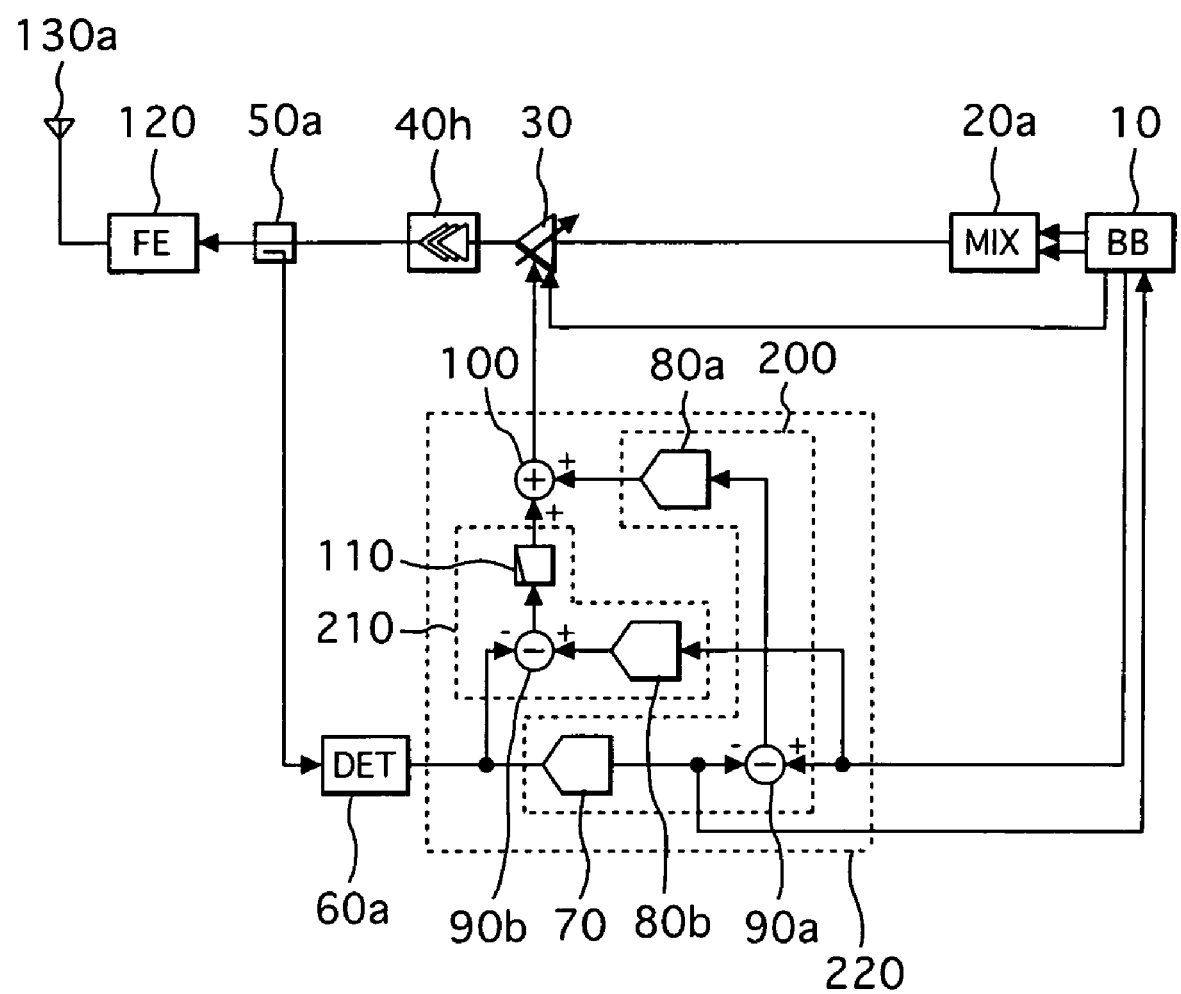
FIG. 20 is a circuit block diagram for describing a fifteenth embodiment showing a power control circuit of the present invention.

A fifteenth embodiment illustrative of a power control circuit of the present invention is shown in FIG. 20. FIG. 20 is a circuit configuration diagram showing a transmitter block of a cellular phone equipped with the power control circuit according to the present embodiment. While the cellular phone to which the present invention is applied is adapted to the GSM system and W-CDMA system in a manner similar to the first embodiment, gain control is carried out by an available gain amplifier 30 without being performed by a power amplifier 40.

In FIG. 20, reference numeral 40h indicates a power amplifier.

The power control circuit according to the present embodiment is basically similar to the first embodiment in configuration. The present embodiment is however different from the first embodiment in that a signal outputted from a comparator 100 results in a control signal inputted to the available gain amplifier 30 without being inputted to the power amplifier 40h.

The power control circuit according to the present embodiment is basically similar to the first embodiment in operation and effect. However, when a GSM mode is performed, the power amplifier 40h is operated in a state in which its bias point is constant (gain control voltage is constant), i.e., a state in which the gain thereof is constant. A signal outputted from the power control circuit 220 is applied to the available gain amplifier 30 as described above. Therefore, the output signal of the available gain amplifier 30, i.e., the power value of the input signal of the power amplifier 40h is controlled. Thus, the present embodiment is different from the first embodiment in that the power value of a signal outputted from the power amplifier 40h is controlled.

Since circuit blocks that perform power control can be integrated or combined into the available gain amplifier 30 in the present embodiment, the facilitation of design is enabled. In the case of a system in which the effect of reducing power consumption or providing high linearization by control on the gain control voltage of the power amplifier 40h is low, the power control circuit according to the present embodiment brings about the effect in particular.

The power control circuit 220 according to the present embodiment can be brought to the power control circuit 220 having the sample and hold circuit 140 employed in the second through fourth embodiments. In such a case, the power control circuit 220 can be applied to each of the cellular phones of the GSM/EDGE system and the W-CDMA system in a manner similar to the second through fourth embodiments. The same cellular phone is configured such that its gain control is performed by the available gain amplifier 30 without being carried out by the power amplifier 40. And the output signal of the power control circuit 220 is inputted to the available gain amplifier 30.

The configuration of a transceiver circuit equipped with the power control circuit 220 may be constituted as any of the transceiver circuits according to the fifth through fourteenth embodiments. The same transceiver circuit is configured in such a manner that its gain control is performed by the available gain amplifier 30 without being carried out by the power amplifier 40.

Sixteenth Preferred Embodiment

Figure 21:
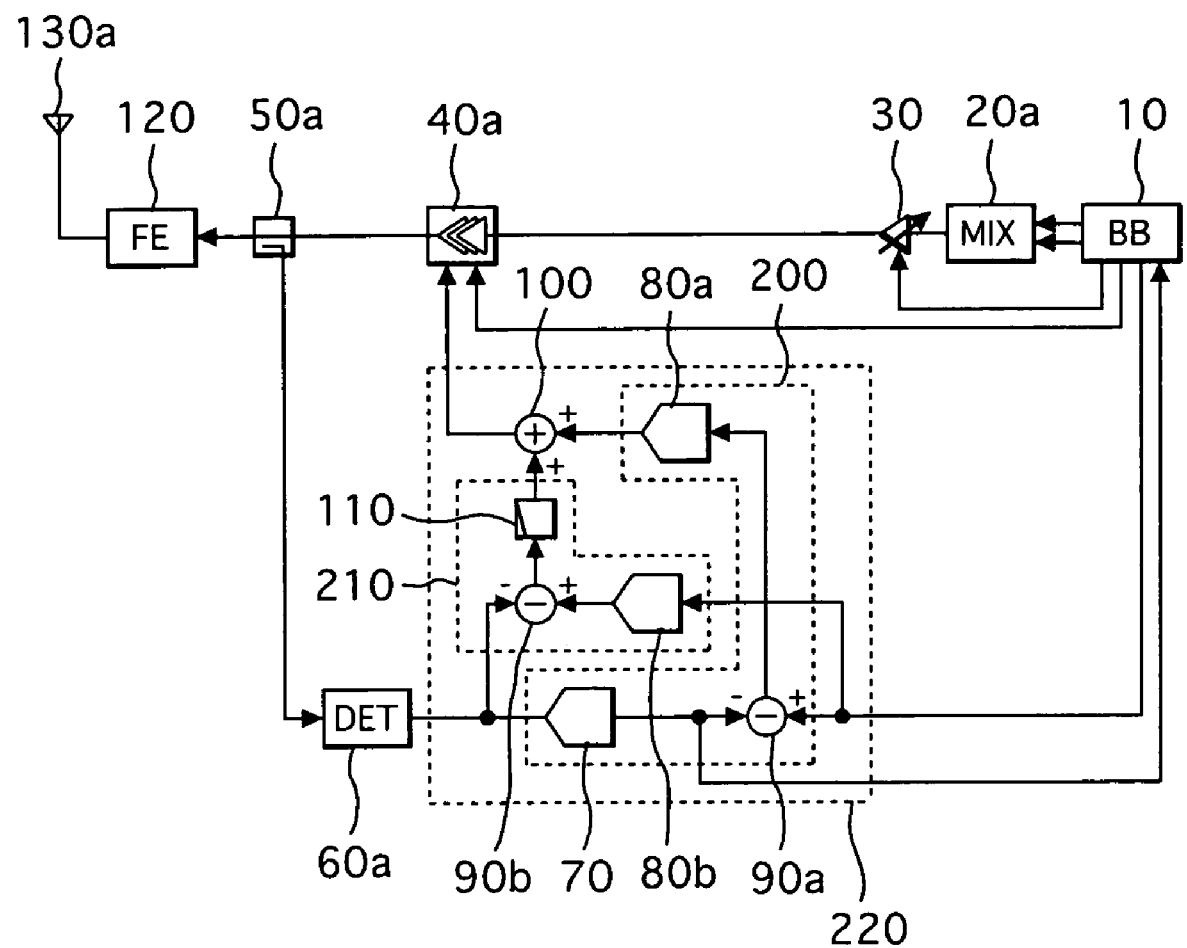
FIG. 21 is a circuit block diagram for describing a sixteenth embodiment showing a power control circuit of the present invention.

A sixteenth embodiment illustrative of a power control circuit of the present invention is shown in FIG. 21. FIG. 21 is a circuit configuration diagram showing a transmitter block of a cellular phone equipped with the power control circuit according to the present embodiment. In a manner similar to the first embodiment, the cellular phone to which the present invention is applied is adapted to GSM and W-CDMA but configured in such a manner that its gain control is performed by a power amplifier 40 and an available gain amplifier 30.

The power control circuit according to the present embodiment is basically similar to the first embodiment in configuration. However, the present embodiment is different from the first embodiment in that a power control signal outputted from a base band signal processor 10 is supplied to both the power amplifier 40 and the available gain amplifier 30 in a W-CDMA mode.

The power control circuit according to the present embodiment is basically similar to the first embodiment in operation and effect. However, the power amplifier 40a is different from that employed in the first embodiment in that in a W-CDMA mode, its input power (output power of available gain amplifier 30) is stepwise controlled and a gain control voltage is continuously controlled by a power control signal (third power control signal), whereby the output power of the power amplifier 40a is controlled. Incidentally, even though the third power control signal for controlling the power amplifier 40a and a second power control signal for controlling the available gain amplifier 30 are identical to each other, the effect of the present embodiment is similar.

Since the output power of the power amplifier 40a is controlled by the gain control voltage in the W-CDMA mode, the present embodiment brings about the effect that a reduction in power consumption at low output can be realized.

Although the configurations, operations and effects of the power control circuits of the present invention have been described above while being divided into the sixteen embodiments, the sixteen embodiments may arbitrarily be utilized in combination.

Further, although the present invention is principally applied to the cellular phone and the configuration, operation and effects of its circuit have been described, the present invention is not limited to the cellular phone and brings about the effects at vehicle equipment, home appliances and other devices and apparatuses using wireless communications.

Furthermore, although GSM, EDGE and W-CDMA have been explained above as the systems for the cellular phone while being taken for instance, the present invention is not limited to above. Arbitrary systems such as a PDC (Personal Digital Cellular), cdmalx, a TD-SCDMA (Time Division Synchronous Code Division Multiple Access), etc. may be adopted.

According to the present invention, since the high frequency element of the feedback signal is generated by the analog feedback loop capable of high-speed operation, the high-speed operation of the power control circuit is stabilized.

It is further understood by those skilled in the art that the foregoing description is a preferred embodiment of the disclosed device and that various changes and modifications may be made in the invention without departing from the spirit and scope thereof.

What is claimed is:

1. A power control circuit that controls a gain of an amplifier in such a manner that output power of the amplifier reaches a desired power value according to a power control signal, comprising:
    a digital feedback loop which converts a detected signal obtained by detecting a power value of the output power of the amplifier to a digital signal, determines a first differential between the detected signal converted to the digital signal and the power control signal, and converts the first differential to a first analog signal and outputs a first feedback signal;
    an analog feedback loop which outputs a high frequency element of a second differential between the power control signal converted to a second analog signal and the detected signal as a second feedback signal; and
    an adder which determines the sum of the first feedback signal and the second feedback signal and outputs a gain control signal for controlling the gain of the amplifier.

2. The power control circuit according to claim 1, wherein said digital feedback loop includes:
    an analog to digital converter which converts the detected signal to the digital signal and outputs the same therefrom,
    a first comparator which outputs the first differential between a digital output signal of said analog to digital converter and the power control signal, and a first digital to analog converter which converts a digital output signal of said first comparator to the first analog signal and outputs the first feedback signal, and wherein said analog feedback loop includes:

a second digital to analog converter which converts the power control signal to the second analog signal and outputs the same therefrom, a second comparator which determines the second differential between the detected signal and the power control signal converted to the second analog signal outputted from said second digital to analog converter, and a high pass filter which takes out the high frequency element of a signal outputted from said second comparator and outputs the second feedback signal.

3. The power control circuit according to claim 2, further comprising:

a first sample and hold circuit which memorizes and holds the detected signal therein;

a second sample and hold circuit which memorizes and holds the power control signal therein; and a third sample and hold circuit which is disposed between said first digital to analog converter and said first comparator and memorizes and holds the digital output signal of said first comparator, wherein the detected signal is inputted to said analog to digital converter and said second comparator via said first sample and hold circuit, and the power control signal is inputted to said second digital to analog converter via said second sample and hold circuit.

4. The power control circuit according to claim 2, further comprising:

a sample and hold circuit which is disposed between said first digital to analog converter and said first comparator and memorizes and holds the digital output signal of said first comparator, wherein said second comparator stops operating when said sample and hold circuit is in operation.

5. A semiconductor device comprising:

a circuit block including, a receiver circuit which amplifies a received first signal;

a first frequency conversion circuit which converts the frequency of the first signal of post-amplification outputted from said receiver circuit to output a second signal;

a second frequency conversion circuit which inputs a third signal to be transmitted and converts the frequency of the third signal to output a fourth signal;

a first amplifier which amplifies the fourth signal outputted from said second frequency conversion circuit and whose gain is controlled by a second power control signal; and a power control circuit which controls output power of an external second amplifier amplifying the fourth signal by use of a first power control signal in such a manner that the output power reaches a desired power value, wherein said power control circuit comprises, a digital feedback loop which converts a detected signal obtained by detecting a power value of the output power of the external second amplifier to a digital signal, determines a first differential between the detected signal converted to the digital signal and the first power control signal, and converts the first differential to a first analog signal and outputs a first feedback signal;

an analog feedback loop which outputs a high frequency element of a second differential between the first power control signal converted to a second analog signal and the detected signal as a second feedback signal; and an adder which determines the sum of the first feedback signal and the second feedback signal and outputs a gain control signal for controlling the output power, and wherein said circuit block is formed over the same semiconductor substrate.

6. The semiconductor device according to claim 5, wherein said digital feedback loop includes:

an analog to digital converter which converts the detected signal to the digital signal and outputs the same therefrom, a first comparator which outputs the first differential between a digital output signal of said analog to digital converter and the first power control signal, and a first digital to analog converter which converts a digital output signal of said first comparator to the first analog signal and outputs the first feedback signal, and wherein said analog feedback loop includes:

a second digital to analog converter which converts the first power control signal to the second analog signal and outputs the same therefrom, a second comparator which determines the second differential between the detected signal and the first power control signal converted to the second analog signal outputted from said second digital to analog converter, and a high pass filter which takes out the high frequency element of a signal outputted from said second comparator and outputs the second feedback signal.

7. The semiconductor device according to claim 6, further comprising:

a first sample and hold circuit which memorizes and holds the detected signal therein;

a second sample and hold circuit which memorizes and holds the first power control signal therein; and a third sample and hold circuit which is disposed between said first digital to analog converter and said first comparator and memorizes and holds the digital output signal of said first comparator, wherein the detected signal is inputted to said analog to digital converter and said second comparator via said first sample and hold circuit, and the first power control signal is inputted to said second digital to analog converter via said second sample and hold circuit.

8. The semiconductor device according to claim 6, further comprising:

a sample and hold circuit which is disposed between said first digital to analog converter and said first comparator and memorizes and holds the digital output signal of said first comparator, wherein said second comparator stops operating when said sample and hold circuit is in operation.

9. The semiconductor device according to claim 5, wherein a gain of the external second amplifier is controlled by the gain control signal and thereby the output power is controlled.

10. The semiconductor device according to claim 5, wherein a gain of said first amplifier is controlled also by the gain control signal, and the output power is controlled according to the gain of said first amplifier controlled by the gain control signal.

11. The semiconductor device according to claim 5, wherein the third signal to be transmitted is a signal of one selected from a first communication system and a second communication system, the second power control signal is used for the first communication system and the first power control signal is used for the second communication system.

12. A transceiver circuit comprising:
a circuit block including,
a first receiver circuit which amplifies a 1 ath signal of a first communication system, which is received by an antenna;
a second receiver circuit which amplifies a 1 bth signal of a second communication system, which is received by the antenna;
a first frequency conversion circuit which converts the frequency of the 1 ath or 1 bth signals of post-amplification outputted from said first or second receiver circuits to thereby output a second signal;
a second frequency conversion circuit which inputs a 3 ath signal to be transmitted of the first communication system or a 3 bth signal to be transmitted of the second communication system and executes frequency conversion to the same to thereby output a fourth signal;
a first amplifier which amplifies the fourth signal outputted from said second frequency conversion circuit and whose gain is controlled by a second power control signal;
a second amplifier which power-amplifies the fourth signal of post-amplification outputted from said first amplifier;
a detector which detects a power value of an output signal of said second amplifier to output a detected signal; and
a power control circuit which controls an output power of said second amplifier by use of a first power control signal in such a manner that the output power reaches a desired power value,
wherein said power control circuit comprises,
a digital feedback loop which converts the detected signal outputted by the detector a digital signal, determines a first differential between the detected signal converted to the digital signal and the first power control signal, and converts the first differential to a first analog signal and outputs a first feedback signal;
an analog feedback loop which outputs a high frequency element of a second differential between the first power control signal converted to a second analog signal and the detected signal as a second feedback signal; and
an adder which determines the sum of the first feedback signal and the second feedback signal and outputs a gain control signal for controlling the output power.

13. The transceiver circuit according to claim 12, wherein said digital feedback loop includes:
an analog to digital converter which converts the detected signal to the digital signal and outputs the same therefrom,
a first comparator which outputs the first differential between a digital output signal of said analog to digital converter and the first power control signal, and
a first digital to analog converter which converts a digital output signal of said first comparator to the first analog signal and outputs the first feedback signal, and wherein said analog feedback loop includes:
a second digital to analog converter which converts the first power control signal to the second analog signal and outputs the same therefrom,
a second comparator which determines the second differential between the detected signal and the first power control signal converted to the second analog signal outputted from said second digital to analog converter, and
a high pass filter which takes out the high frequency element of a signal outputted from said second comparator and outputs the second feedback signal.

14. The transceiver circuit according to claim 13, further comprising:
a first sample and hold circuit which memorizes and holds the detected signal therein;
a second sample and hold circuit which memorizes and holds the first power control signal therein; and
a third sample and hold circuit which is disposed between said first digital to analog converter and said first comparator and memorizes and holds the digital output signal of said first comparator,
wherein the detected signal is inputted to said analog to digital converter and said second comparator via said first sample and hold circuit, and the first power control signal is inputted to said second digital to analog converter via said second sample and hold circuit.

15. The transceiver circuit according to claim 12, wherein the second power control signal is used for the first communication system and the first power control signal is used for the second communication system.

16. The transceiver circuit according to claim 15, wherein a gain of the external second amplifier is controlled by the gain control signal and thereby the output power is controlled.

17. The transceiver circuit according to claim 15, wherein a gain of said first amplifier is controlled also by the gain control signal, and the output power is controlled according to the gain of said first amplifier controlled by the gain control signal.

18. The transceiver circuit according to claim 15, wherein the first communication system is W-CDMA (Wide-band Code Division Multiple Access) and the second communication system is at least either GSM (Global System for Mobile Communication) or EDGE (Enhanced Data rates for GSM Evolution).

19. The transceiver circuit according to claim 12, wherein the antenna comprises a first antenna and a second antenna, the 1 ath signal of the first communication system is received by the first antenna, and the 1 bth signal of the second communication system is received by the second antenna.

20. The transceiver circuit according to claim 12, which is formed over the same substrate as a module.

* * * * *